United States Patent
Brebner et al.

(10) Patent No.: US 8,065,130 B1
(45) Date of Patent: Nov. 22, 2011

(54) METHOD FOR MESSAGE PROCESSING ON A PROGRAMMABLE LOGIC DEVICE

(75) Inventors: Gordon J. Brebner, San Jose, CA (US); Philip B. James-Roxby, Longmont, CO (US); Eric R. Keller, Boulder, CO (US); Chidamber R. Kulkarni, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 274 days.

(21) Appl. No.: 12/465,247

(22) Filed: May 13, 2009

Related U.S. Application Data

(62) Division of application No. 10/769,592, filed on Jan. 30, 2004, now Pat. No. 7,552,042.

(51) Int. Cl.
*G06F 17/50* (2006.01)

(52) U.S. Cl. ............ 703/14; 703/22; 716/117; 716/116; 718/102; 718/103; 718/104; 717/107; 717/149; 717/131

(58) Field of Classification Search ............. 703/13–23; 716/101, 105; 718/102
See application file for complete search history.

(56) References Cited

U.S. PATENT DOCUMENTS

| | | | |
|---|---|---|---|
| 5,113,392 A | 5/1992 | Takiyasu et al. | |
| 5,778,230 A * | 7/1998 | Wimble et al. | 717/131 |
| 5,867,180 A | 2/1999 | Katayama et al. | |
| 6,078,736 A * | 6/2000 | Guccione | 716/117 |
| 6,182,183 B1 | 1/2001 | Wingard et al. | |
| 6,230,307 B1 * | 5/2001 | Davis et al. | 716/116 |
| 6,324,629 B1 | 11/2001 | Kulkarni et al. | |
| 6,405,160 B1 | 6/2002 | Djaja et al. | |
| 6,408,163 B1 | 6/2002 | Fik | |
| 6,581,187 B2 | 6/2003 | Gupta et al. | |
| 6,647,431 B1 | 11/2003 | Utas | |
| 6,671,869 B2 | 12/2003 | Davidson et al. | |
| 6,704,914 B2 | 3/2004 | Nishida et al. | |
| 6,735,770 B1 | 5/2004 | Yeager et al. | |
| 6,794,896 B1 | 9/2004 | Brebner | |
| 6,891,397 B1 | 5/2005 | Brebner | |
| 6,904,431 B2 | 6/2005 | Holmgren | |
| 6,918,103 B2 | 7/2005 | Brawn et al. | |
| 6,952,825 B1 * | 10/2005 | Cockx et al. | 718/102 |
| 6,983,461 B2 * | 1/2006 | Hutchison et al. | 718/104 |
| 7,058,562 B2 * | 6/2006 | Powell | 703/22 |
| 7,131,077 B1 | 10/2006 | James-Roxby et al. | |
| 7,137,116 B2 * | 11/2006 | Parkes et al. | 718/102 |
| 7,185,309 B1 | 2/2007 | Kulkarni et al. | |

(Continued)

OTHER PUBLICATIONS

Brebner, Gordon, "Multithreading for Logic-Centric Systems," *Proc. of the 12th Int'l. Conference on Field Programmable Logic and Applications*, Sep. 2-4, 2002, pp. 5-14, Montepellier, France.

(Continued)

*Primary Examiner* — Kamini S Shah
*Assistant Examiner* — Cuong Luu
(74) *Attorney, Agent, or Firm* — Robert M. Brush; Lois D. Cartier

(57) ABSTRACT

Programmable architecture for implementing a message processing system using an integrated circuit is described. In an example, configurable logic of an integrated circuit is configured to have a plurality of thread circuits and a memory. Messages are received to the integrated circuit for storage in the memory. The memory is accessed with the plurality of threads to concurrently process a plurality of the messages.

11 Claims, 15 Drawing Sheets

U.S. PATENT DOCUMENTS

| | | | | |
|---|---|---|---|---|
| 7,209,979 | B2 * | 4/2007 | Solomon et al. | 709/249 |
| 7,228,520 | B1 | 6/2007 | Keller et al. | |
| 7,376,954 | B2 * | 5/2008 | Kissell | 718/107 |
| 7,379,451 | B1 | 5/2008 | Brebner | |
| 7,401,333 | B2 * | 7/2008 | Vandeweerd | 718/102 |
| 2002/0067717 | A1 | 6/2002 | Raschke et al. | |
| 2002/0120912 | A1 | 8/2002 | He et al. | |
| 2002/0129173 | A1 | 9/2002 | Weber et al. | |
| 2002/0162097 | A1 * | 10/2002 | Meribout | 717/155 |
| 2002/0170038 | A1 | 11/2002 | Yeh et al. | |
| 2002/0188923 | A1 | 12/2002 | Ohnishi | |
| 2003/0028854 | A1 * | 2/2003 | Nishida et al. | 716/18 |
| 2003/0033374 | A1 | 2/2003 | Horn et al. | |
| 2003/0056084 | A1 | 3/2003 | Holgate et al. | |
| 2003/0097481 | A1 * | 5/2003 | Richter | 709/251 |
| 2003/0126186 | A1 | 7/2003 | Rodgers et al. | |
| 2003/0126195 | A1 | 7/2003 | Reynolds et al. | |
| 2003/0144980 | A1 | 7/2003 | Holmgren | |
| 2003/0145210 | A1 | 7/2003 | Taylor | |
| 2003/0182083 | A1 | 9/2003 | Schwenke et al. | |
| 2003/0188099 | A1 * | 10/2003 | Baxter, III | 711/114 |
| 2003/0188100 | A1 * | 10/2003 | Solomon et al. | 711/114 |
| 2004/0006584 | A1 * | 1/2004 | Vandeweerd | 709/107 |
| 2004/0071152 | A1 | 4/2004 | Wolrich et al. | |
| 2004/0078448 | A1 | 4/2004 | Malik et al. | |
| 2004/0083269 | A1 | 4/2004 | Cummins | |
| 2004/0128120 | A1 | 7/2004 | Coburn et al. | |
| 2004/0187112 | A1 | 9/2004 | Potter | |
| 2004/0225965 | A1 | 11/2004 | Garside et al. | |
| 2005/0034090 | A1 | 2/2005 | Sato et al. | |
| 2005/0038806 | A1 | 2/2005 | Ma | |
| 2005/0086565 | A1 * | 4/2005 | Thompson et al. | 714/741 |
| 2005/0114593 | A1 | 5/2005 | Cassell et al. | |
| 2005/0172085 | A1 | 8/2005 | Klingman | |
| 2005/0172087 | A1 | 8/2005 | Klingman | |
| 2005/0172088 | A1 | 8/2005 | Klingman | |
| 2005/0172089 | A1 | 8/2005 | Klingman | |
| 2005/0172090 | A1 | 8/2005 | Klingman | |
| 2005/0172289 | A1 | 8/2005 | Klingman | |
| 2005/0172290 | A1 | 8/2005 | Klingman | |
| 2005/0177671 | A1 | 8/2005 | Klingman | |
| 2005/0210178 | A1 | 9/2005 | Klingman | |
| 2005/0223384 | A1 | 10/2005 | Klingman | |
| 2005/0262286 | A1 | 11/2005 | Klingman | |
| 2006/0041684 | A1 | 2/2006 | Daniell et al. | |

OTHER PUBLICATIONS

Brebner, Gordon, "Single-chip Gigabit Mixed-version IP Router on Virtex-II Pro," *Proc. of the 10th Annual IEEE Symposium on Field-Programmable Custom Computing Machines*, Apr. 5-7, 2002, pp. 35-44, Napa, California, USA.

Keller, Eric et al., "Programming a Hyper-Programmable Architecture for Networked Systems," *Proc. of the 2004 Int;l. Conference on Field-Programmable Technologies*, Dec. 6-8, 2004, pp. 1-8, Brisbane, Australia.

U.S. Appl. No. 10/420,652, filed Apr. 21, 2003, Brebner.
U.S. Appl. No. 10/769,592, filed Jan. 30, 2004, Brebner et al.
U.S. Appl. No. 10/769,330, filed Jan. 30, 2004, James-Roxby al.
U.S. Appl. No. 11/067,431, filed Feb. 25, 2005, Keller et al.
U.S. Appl. No. 11/699,097, filed Jan. 29, 2007, Kulkarni et al.

* cited by examiner

METHOD FOR MESSAGE PROCESSING ON A PROGRAMMABLE LOGIC DEVICE

FIELD OF THE INVENTION

One or more aspects of the present invention relate generally to integrated circuit design tools and, more particularly, to a programmable architecture for implementing a message processing system using an integrated circuit.

BACKGROUND

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. Additionally, an FPGA may include embedded memory, such as block random access memories (BRAMs), one or more microprocessors, sometimes referred to as embedded cores, and digital clock managers (DCMs). The combination of components on an FPGA may be used for system-level integration, sometimes referred to as "system-on-a-chip" (SOC).

Historically, FGPAs have not been employed in network processing applications. Rather, Network devices, such as routers, employ dedicated, special purpose components for processing packets that propagate through the network. Conventionally, network devices employ network processors or application specific integrated circuits (ASICs) to provide the desirable packet processing/network processing functions. Such processor- or ASIC-based architectures, however, are static in nature, providing a fixed amount of resources for packet processing/network processing functions. Accordingly, there exists a need in the art for more flexible message processing architectures.

SUMMARY

One aspect of the invention relates to message processing using an integrated circuit. In one embodiment, configurable logic of an integrated circuit is configured to have a plurality of thread circuits and a memory. Messages are received to the integrated circuit for storage in the memory. The memory is accessed with the plurality of threads to concurrently process a plurality of the messages.

Another aspect of the invention relates to designing a message processing system for implementation using an integrated circuit. Specification data is received for specifying processing operations and memory attributes of the message processing system. A logical description of the message processing system is generated in response to the specification data, where the logical description includes a memory component and a processing component. A physical description of the message processing system is generated in response to the logical description. The physical description includes at least one memory circuit for implementing the memory component and a plurality of threads for implementing the processing component.

Another aspect of the invention relates to a design tool for designing a message processing system for implementation using an integrated circuit. An input section is configured to specify processing operations and memory attributes of the message processing system. A first database is configured to store a message processing architecture having a memory component and a processing component. A second database is configured to store an integrated circuit architecture. A message processing section includes a first portion and a second portion. The first portion is configured to generate an instance of the memory component and an instance of the processing component to produce a logical view of the message processing system. A second portion is configured to implement the memory component instance and the processing component instance in terms of the integrated circuit architecture to produce a physical view of the message processing system.

Another aspect of the invention relates to message processing using an integrated circuit. Circuitry is configured to receiving message to the integrated circuit. A memory is configured to storing the messages. A first configured portion within the integrated circuit is adapted for concurrently accessing the memory with a plurality of thread circuits to process the messages.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
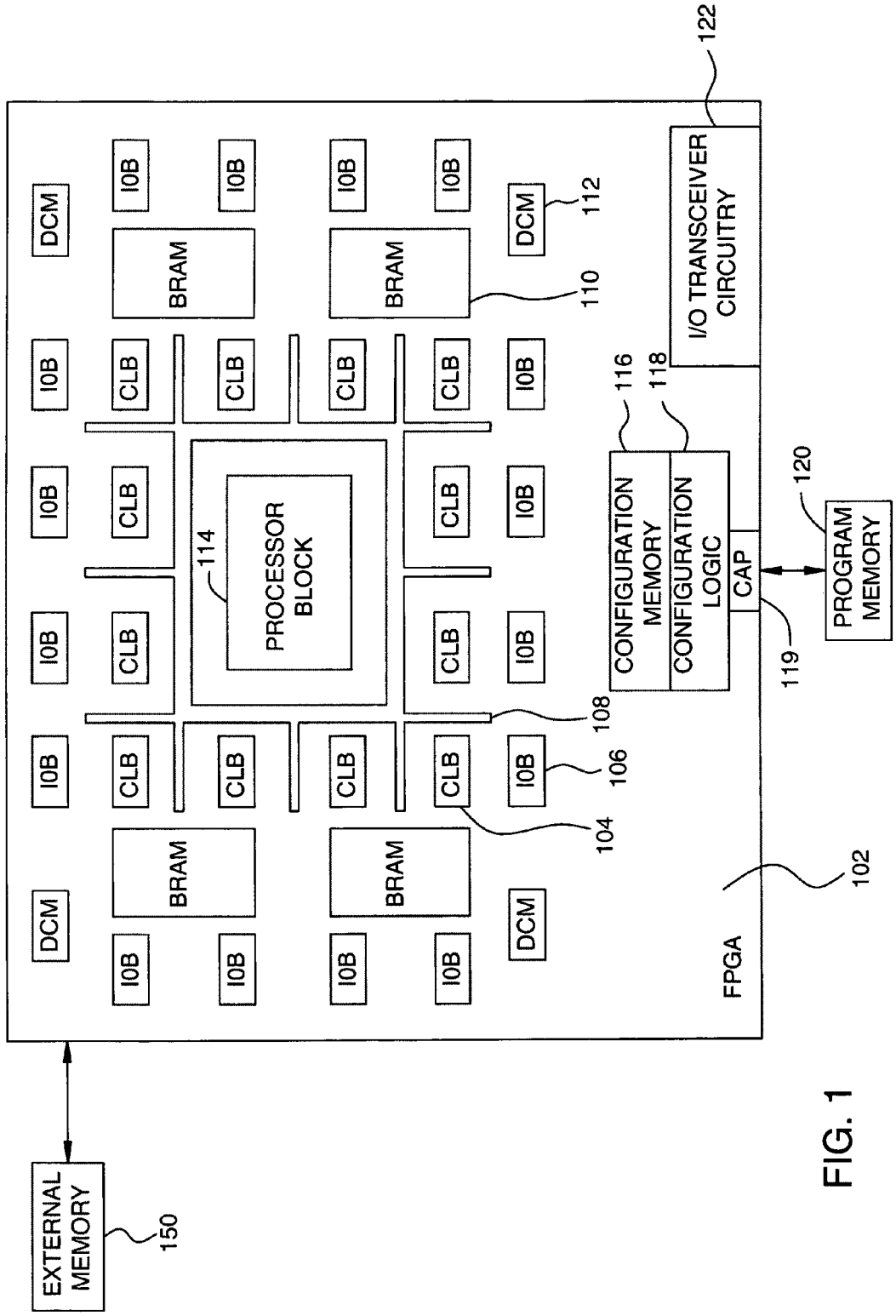
FIG. 1 is a block diagram depicting an exemplary embodiment of an FPGA coupled to external memory and a program memory.

To facilitate understanding of the invention, the description has been organized as follows:

Overview, introduces aspects of the invention and exemplary embodiments of their relationships to one another;

Soft Platform, describes a programmable architecture and associated design tool for implementing a message processing system using an integrated circuit;

Memory Model, describes an application-specific programmable memory architecture and interconnection network for an integrated circuit;

Multithread Model, describes an inter-process synchronization mechanism for threads implemented within a configurable logic portion of an integrated circuit; and Programming Interface, describes a programming interface for a design tool embodying a soft architecture for implementing a message processing system using an integrated circuit.

Overview

One or more aspects of the invention are related to a configurable and programmable micro-architecture for implementing message-processing (MP) systems ("soft platform architecture"). As used herein, the term "message" encompasses packets, cells, frames, data units, and like type blocks of information known in the art that is passed over a communication channel. A "message-processing" system is a system or subsystem for processing messages (e.g., a packet processing system or a network processing system). The soft platform architecture is "message-centric" to match the nature of MP systems. That is, the processing components of the MP system go to the messages, as opposed to the messages coming to the processing components.

Briefly stated, a designer specifies attributes for an MP system, such as structural and behavioral attributes for processing components and memory components. For example, the designer may employ a set of descriptions or "primitives" that parametrically define the MP system attributes. The primitives provide an abstract mechanism for defining the MP system. A design tool embodying the soft platform architecture may include a programming interface for generating a logical description or "logical view" of an MP system based on the designer-specified attributes.

Notably, the logical view includes logical components of the soft platform architecture configured in accordance with the designer-specified MP system. In particular, the soft platform architecture includes a memory model component and a multithreading component. A physical view of the MP system may then be generated based on the logical view. The physical view includes physical components of an integrated circuit architecture that implement the logical components of the soft platform architecture. The physical view may then be processed to generate configuration data for the integrated circuit to realize the designer-specified MP system (e.g., a configuration bitstream for a PLD or mask data for an ASIC). Thus, the soft platform architecture provides a mechanism by which a designer may design an MP system in an abstract fashion, without knowledge of the particular physical configuration of the integrated circuit.

One or more aspects of the invention are described with respect to a programmable architecture for implementing a message processing system using an FPGA. While the invention is described with specific reference to an FPGA, those skilled in the art will appreciate that other types of programmable logic devices may be used, such as complex programmable logic devices (CPLDs). In addition, other types of mask-programmable devices may be used, such as application specific integrated circuits (ASICs). Those skilled in the art will appreciate that, if an ASIC is employed rather than an PLD, then mask data is generated in place of a configuration bitstream.

FIG. 1 is a block diagram depicting an exemplary embodiment of an FPGA 102 coupled to external memory 150 and a program memory 120. The external memory 150 may comprise, for example, synchronous dynamic RAM (SDRAM), double-data rate SDRAM (DDR SDRAM), Rambus® RAM (RDRAM), and the like. For purposes of clarity by example, the memory 150 is referred to as "external" in that the memory 150 is not part of the FGPA 102. It is to be understood, however, that the external memory 150 and the FPGA 102, as well as various other devices, may be integrated onto a single chip to form a single system-level integrated circuit (referred to as a "system-on-a-chip" or SoC).

The FPGA 102 illustratively comprises programmable logic circuits or "blocks", illustratively shown as CLBs 104, IOBs 106, and programmable interconnect 108 (also referred to as "programmable logic"), as well as configuration memory 116 for determining the functionality of the FPGA 102. The FPGA 102 may also include an embedded processor block 114, as well as various dedicated internal logic circuits, illustratively shown as blocks of random access memory ("BRAM 110"), configuration logic 118, digital clock management (DCM) blocks 112, and input/output (I/O) transceiver circuitry 122. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and controls configuration of, the configuration memory 116. A configuration bitstream produced from the program memory 120 may be coupled to the configuration logic 118 through a configuration port 119. The configuration process of FPGA 102 is also well known in the art.

The I/O transceiver circuitry 122 may be configured for communication over any of a variety of media, such as wired, wireless, and photonic, whether analog or digital. The I/O transceiver circuitry 122 may comprise gigabit or multi-gigabit transceivers (MGTs). The DCM blocks 112 provide well-known clock management circuits for managing clock signals within the FPGA 102, such as delay lock loop (DLL) circuits and multiply/divide/de-skew clock circuits.

The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a Microblaze™ soft microprocessor, available from Xilinx® of San Jose, Calif., may be employed. A hard microprocessor may be implemented using an IBM Power PC, Intel Pentium, AMD Athlon, or like type processor core known in the art.

The processor block 114 is coupled to the programmable logic of the FPGA 102 in a well known manner. For purposes of clarity by example, the FPGA 102 is illustrated with 12 CLBs, 16 IOBs, 4 BRAMs, 4 DCMs, and one processor block. Those skilled in the art will appreciate that actual FPGAs may include one or more of such components in any number of different ratios. For example, the FPGA 102 may be selected from the Virtex™-II Pro family of products, commercially available from Xilinx® of San Jose, Calif.

Figure 17:
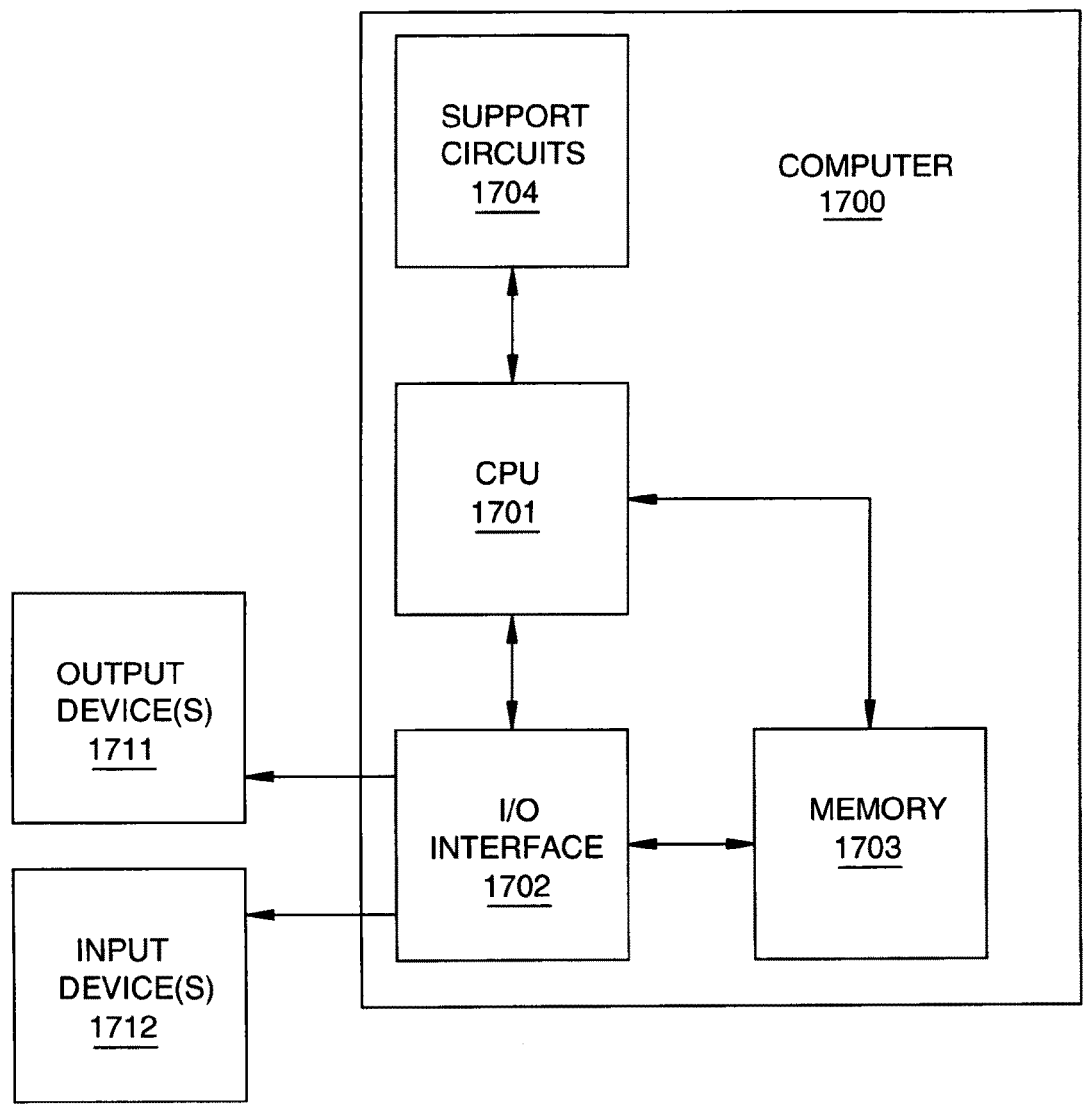
FIG. 17 is a block diagram depicting an exemplary embodiment of a computer suitable for implementing processes, methods, and system sections described herein.

One or more aspects of the invention include design tools for designing MP systems, memory systems, and multi-threading systems. Such design tools may be implemented using a computer. Notably, FIG. 17 is a block diagram depicting an exemplary embodiment of a computer 1700 suitable for implementing processes, methods, and design tool sections described herein. The computer 1700 includes a central processing unit (CPU) 1701, a memory 1703, various support circuits 1704, and an I/O interface 1702. The CPU 1701 may be any type of microprocessor known in the art. The support circuits 1704 for the CPU 1701 include conventional cache, power supplies, clock circuits, data registers, I/O interfaces, and the like. The I/O interface 1702 may be directly coupled to the memory 1703 or coupled through the CPU 1701. The I/O interface 1702 may be coupled to various input devices 1712 and output devices 1711, such as a conventional keyboard, mouse, printer, display, and the like.

The memory 1703 may store all or portions of one or more programs and/or data to implement the processes, methods, and design tool sections described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 1700 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 1703. The memory 1703 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Soft Platform

Figure 2:
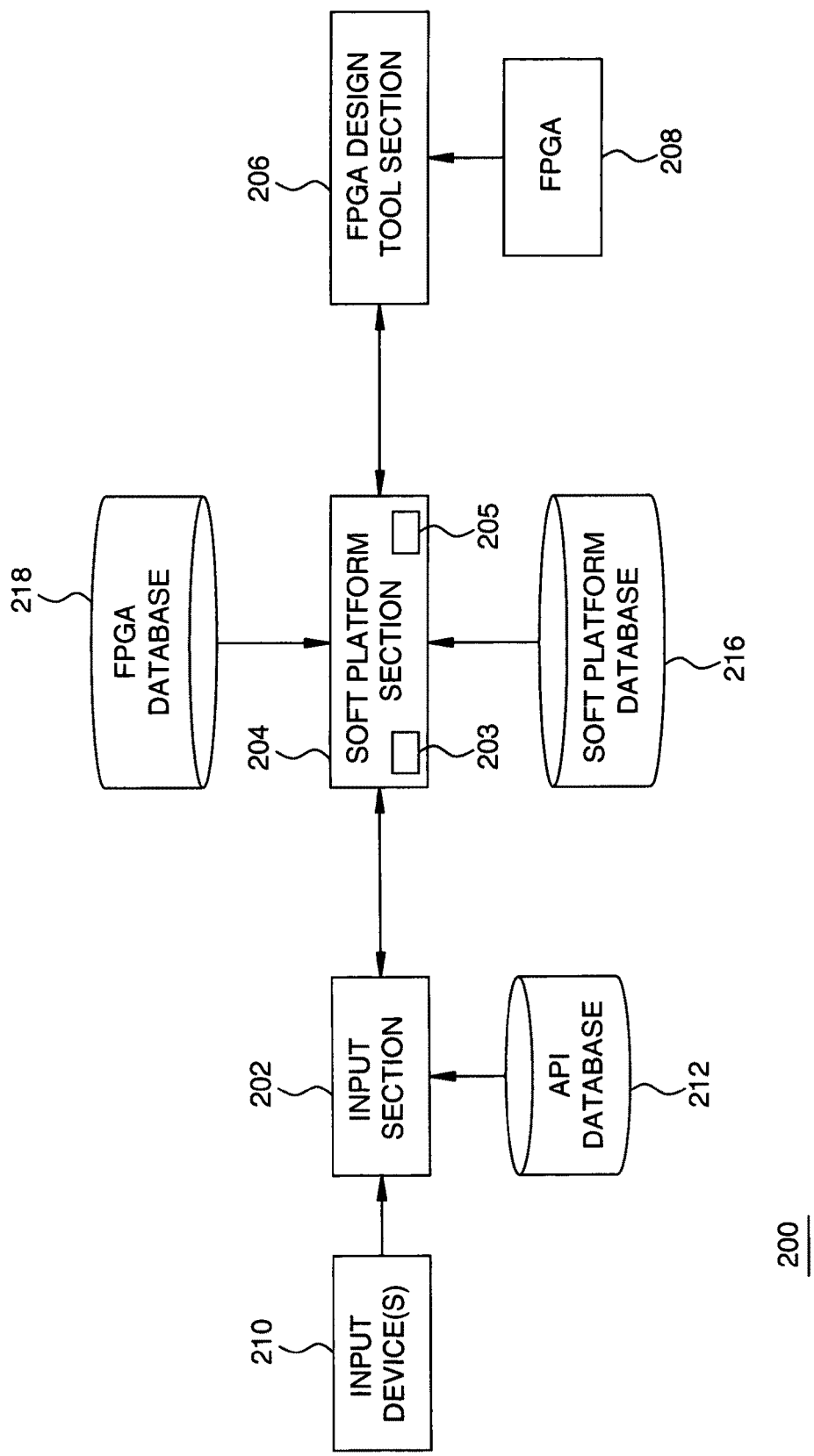
FIG. 2 is a block diagram depicting an exemplary embodiment of a design tool for designing a message processing system for implementation using an FPGA.

FIG. 2 is a block diagram depicting an exemplary embodiment of a design tool 200 for designing an MP system for implementation using an FPGA. The design tool 200 comprises an input section 202, a soft platform section 204, and an FPGA design tool section 206. Briefly stated, the soft platform section 204 provides a configurable and programmable soft platform architecture for implementing MP systems. An MP system implemented using the soft platform architecture is mapped onto an FPGA architecture to produce a physical circuit design. The MP system may be realized by configuring an FPGA 208 in accordance with the circuit design. Thus, the soft platform architecture provides a mapping between a logical, message-centric system design and a physical, interface-centric system implemented within the FPGA 208.

Notably, the FPGA circuit design may be "interface-centric" in that the circuit design is driven by the behavior at the system interfaces, as opposed to the "processor-centric" model, where the circuit design is driven by the behavior of an embedded processor. The interface-centric circuit design model matches well with the message-centric style of the soft platform architecture. Placement and usage of interfaces, memories, and their interconnections dominate the allocation of FPGA architecture features, and then allocation of functional elements (e.g., programmable logic, embedded processors) for the process components follow as a derivative.

More specifically, the input section 202 is coupled to one or more input devices 210 and a database storing an application programming interface (API) ("API database 212"). The API database 212 includes a set of primitives associated with structural and behavioral attributes of the soft platform architecture. Thus, the API provides a "programming interface" for the soft platform architecture. An exemplary embodiment of a programming interface for a soft platform architecture is described below in the section entitled "PROGRAMMING INTERFACE." Using the input devices 210, a designer may interact with the input section 202 to produce specification data for an MP system or subsystem if the MP circuit is part of a larger system (hereinafter referred to as an "MP system").

Notably, in one embodiment, a designer may use the primitives in the API database 212 directly to produce the MP system specification data for the soft platform architecture. In another embodiment, a designer may design the MP system using alternate constructions provided by the input section 202. That is, the input section 202 may comprise a design entry tool specific to the MP domain. Examples of such MP-specific design-entry tools include Click (available from The Massachusetts Institute of Technology), Rave (available from Cloudshield™ of Sunnyvale, Calif.), and SDL (a telecom standard from ITU-T). The input section 202 may then map the MP system specified using the alternate constructions onto the primitives in the API database 212 for the soft platform architecture. Thus, the input section 202 may provide a different level of abstraction than that provided by the soft platform architecture.

In one embodiment of the invention, the MP system specification data may comprise program code for programmatically interacting with the soft platform section 204. The program code may be callable by an external design tool of the input section 202. In another embodiment, the MP system specification data may comprise interpretive descriptions (e.g., descriptions in a textual or binary format) that the soft platform section 204 may interpret (e.g., an XML format). In either embodiment, the MP system specification is used to configure the soft platform architecture.

The soft platform section 204 is coupled to the input section 202 for receiving the MP system specification data. The soft platform section 204 is also coupled to a database storing the features or attributes of the soft platform architecture ("soft platform database 216"), and a database storing features or attributes of the architecture of the FPGA 208 ("FPGA database 218").

The soft platform section 204 includes a first portion 203 for generating a logical description or "logical view" of an MP system in accordance with the MP system specification. The logical view is defined in terms of the logical components of the soft platform architecture stored in the soft platform database 216. The soft platform section 204 includes a second portion 205 for generating a physical view of the MP system. Notably, using information in the FPGA database 218, the soft platform section 204 maps the logical view of the MP system defined in terms of the soft platform architecture onto the architecture of the FPGA 208. The soft platform section 204 provides FPGA design data as output, which represents a "physical view" of the MP system in terms of the architecture of the FPGA 208. Details of the soft platform architecture are described below with respect to FIG. 4.

The FPGA design tools section 206 is coupled to the soft platform section 204 for receiving the FPGA design data. The FPGA design data may comprise a physical description of the MP system specified by the designer in terms of the components and features of the FPGA 208. For example, in one embodiment, the FPGA design data may comprise a hardware description language (HDL) representation of the MP system design (e.g., Very high-speed integrated circuit description language (VHDL) or Verilog). The FPGA design tools section 206 processes the FPGA design data to produce configuration bitstream data. For example, the FPGA design tools section 206 may comprise various well-known FPGA design tools, such as a synthesis tool, a map/place/route tool, like-type tools known in the art. The FPGA design tools section 206 provides configuration bitstream data as output, which may be loaded into the FGPA 208.

Figure 3:
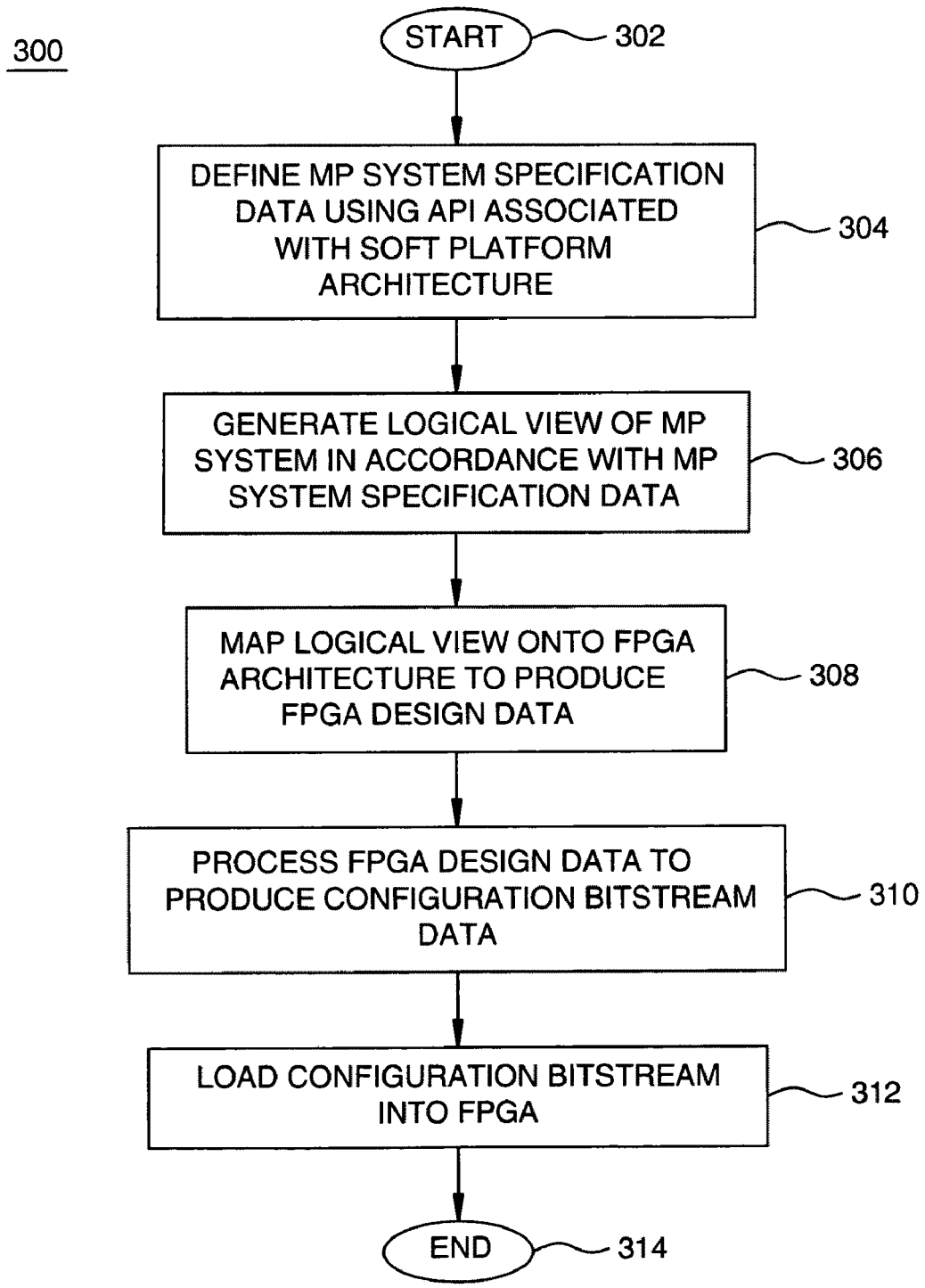
FIG. 3 is a flow diagram depicting an exemplary embodiment of a process for designing a message processing system for implementation within an FPGA.

FIG. 3 is a flow diagram depicting an exemplary embodiment of a process 300 for designing an MP system for implementation using FPGA. The process 300 may be performed by the design tool 200 shown in FIG. 2. The process 300 begins at step 302. At step 304, an MP system specification is defined using an API associated with a soft platform architecture. The MP system specification specifies attributes of an MP system, such as processing operations and memory attributes. As described above, the API may be programmatic (e.g., software function calls) or interpretive (e.g., XML).

At step 306, a logical view of the MP system is generated in accordance with the MP system specification. As described above, the logical view of the MP system is defined in terms of a soft platform architecture. The logical components of the soft platform architecture are configured in accordance with the MP system specification to generate the logical view of the MP system. The term "logical components" refers to both the structural and behavioral attributes of the soft platform architecture, described in more detail below.

At step 308, the logical view of the MP system is mapped onto an FPGA architecture to produce FPGA design data. That is, the logical components comprising the logical view are linked to physical components of an FPGA and, optionally, other devices connected to the FPGA (e.g., external memories). In one embodiment of the invention, the FPGA design data comprises an HDL representation of the MP system design. As described above, the FPGA design data provides a physical view of the specified MP system in terms of the architecture of the FPGA. That is, FPGA design data corresponds to the physical implementation of the logical view of the MP system on an FPGA device.

At step 310, the FPGA system design is processed to produce configuration bitstream data. For example, if the FPGA system design comprises an HDL representation of the MP system design, the FPGA system design may be synthesized, mapped, placed, and routed in a well-known manner to produce bitstream data for configuring an FPGA. At step 312, the configuration bitstream data is loaded into an FPGA to realize the MP system specified at step 304. The process 300 ends at step 314.

Figure 4:
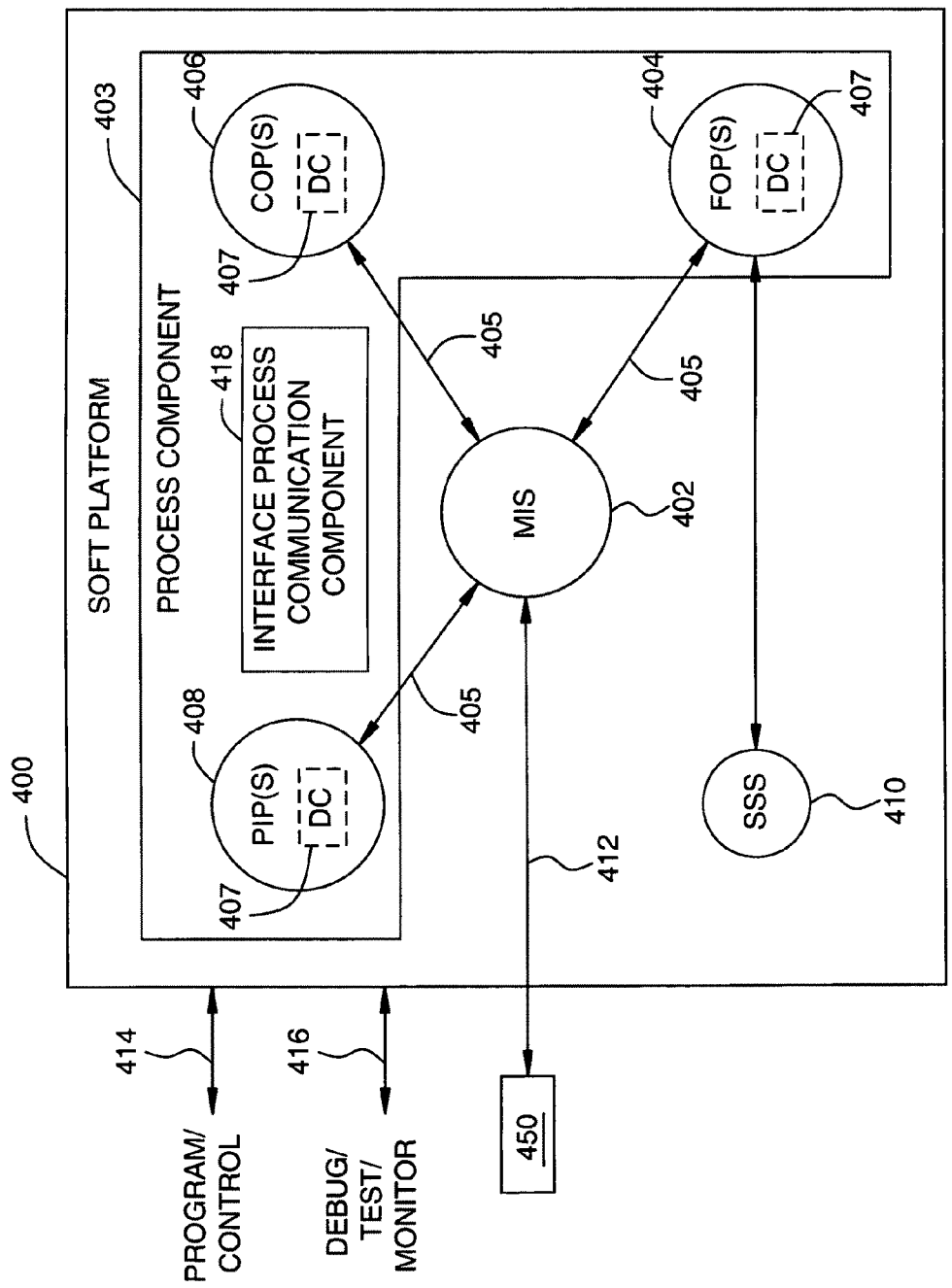
FIG. 4 is a block diagram depicting an exemplary embodiment of a soft platform architecture in accordance with one or more aspects of the invention.

FIG. 4 is a block diagram depicting an exemplary embodiment of a soft platform architecture 400 in accordance with one or more aspects of the invention. The soft platform architecture 400 comprises a messages in system (MIS) component 402, a process component 403, and a stored system state (SSS) component 410. The MIS component 402, the process component 403, and the SSS component 410 are logical components with no implied physical implementations. The physical implementations of the MIS component 402, the process component 403, and the SSS component 410 may be programmable, static, or partially programmable and partially static. The programmable portion of any of the MIS component 402, the process component 403, and the SSS component 410 may be conveyed via API primitives that define specification data generated by a designer.

Notably, the soft platform architecture 400 includes a programming/control interface 414 and a debug/test/monitor interface 416. The programming/control interface 414 conveys the data for configuring the programmable portions of the soft platform architecture 400. The programming/control information conveyed via the programming/control interface 414 comprises the structural and behavioral information related to the MIS component 402, the process component 403, and the SSS component 410. An exemplary embodiment of a programming interface to the soft platform architecture 400 is described below in the section entitled "PROGRAMMING INTERFACE." The debug/test/monitor interface 416 may be used during the design and implementation of an MP system defined in terms of the soft platform architecture 400. The interfaces 414 and 416 are illustrative, as there may be a single shared interface, or more than two interfaces.

The MIS component 402 is the logical storage point for all messages currently within the system implemented using the soft platform architecture 400. The MIS component 402 includes an interface 412 to the enclosing environment 450 allowing for the input and output of messages. For example, the soft platform architecture 400 may be configured to produce an internet protocol (IP) packet router. The MIS component 402 may be configured to store all IP packets currently in flight through the router. The interface 412 may be one or more ports by which the router is connected to a physical network.

The MIS component 402 may be physically implemented using a centralized memory device, a plurality of distributed memory devices, or a combination thereof. In addition, the types, sizes, and interconnections of the physical memory elements, as well as the interface to such physical memory elements, are programmable through configuration of the MIS component 402. An exemplary embodiment of a logical memory configuration that may be used as the MIS component 402 is described below in the section entitled "MEMORY MODEL."

The process component 403 comprises one or more processes that may be classified as fine grain operations processes (FOPs) 404, coarse grain operations processes (COPs) 406, or perimeter interface processes (PIPs) 408. In addition, the process component 403 includes an inter-process synchronization component 418. The FOPs 404, COPs 406, and PIPs 408 operate on messages stored within the MIS component 402. The term "process," as used herein, denotes a concurrent agent for operating on information stored within the MIS component 402. The term "thread" is used to denote an instance of a process.

Notably, each single execution of a process within the process component 403 is associated with a message stored in the MIS component 402 through a message context 405. A process in the process component 403 may be physically implemented directly in programmable logic of an FPGA, or in a soft or hard embedded processor of an FPGA. In one embodiment of the invention, the message context 405 may be implemented using a data counter (DC) component 407. The DC component 407 points to the current position in the current message being operated on by a particular process in the process component 403. As the process executes, the DC component 407 may be updated, either automatically to advance to the next position in a message, or by execution of programmed "data jumps." In essence, the process moves over the message. The DC component 407 may be physically implemented using a memory element within the FPGA capable of storing an address associated with the location of a message in the memory of the MIS component 402. Depending on the memory organization of the MIS component 402, the DC component 407 may be a register, a BRAM, or an external RAM.

The processes of the process component 403 include a common interface. The inter-process communication component 418 may utilize the common interface to allow interaction between processes of the process component 403. Such interactions may include, for example, creating or destroying a process or passing data to another process. The inter-process communication component 418 provides for a control flow in the processing of a message. At a microscopic level, the inter-process communication component 418 is capable of providing a control flow within a single process's execution. At a macroscopic level, the inter-process communication component 418 is capable of providing a control flow from one process's execution to another process's execution. An exemplary embodiment of a multithread model that may be used as the inter-process communication component 418 is described below in the section entitled "MULTITHREAD MODEL."

A FOP 404 is the basic programmable unit for message processing. A FOP 404 performs a sequence of steps on a message stored within the MIS component 402. At each step, a set of concurrent operations are performed. A FOP 404 may be associated with a DC component 407. After each step, the DC component 407 may be incremented, or a data jump operation performed, such that the FOP 404 accesses a new portion of the message. The steps, as well as the operations performed during each step, may be programmable, static, or partially programmable and partially static in their definition. Examples of operations include, inspecting a field (e.g., a 16-bit header field) of a message, or performing simple arithmetic (e.g., adding one to a 16-bit header field) on a message.

A FOP 404 may be implemented within an FPGA using programmable logic. For example, a FOP may be implemented as a finite state machine (FSM) configured within the programmable logic of the FPGA. Alternatively, a FOP may be implemented on an embedded processor within an FPGA. For example, a FOP may be implemented as an operating system thread executed by the embedded processor. The physical implementation of a FOP 404 may be programmable, static, or partially programmable and partially static in its definition.

A COP 406 is used to incorporate a function block to perform a message processing operation. A function block may comprise a circuit or subsystem defined outside the context of the soft platform architecture 400. For example, the function block may comprise a reusable intellectual property (IP) core for an FPGA. A COP 406 provides a programmable adapter between the interface of the function block and the common interface of the process component 403. A COP 406 may be started, stopped, or interrupted by another process of the process component 403.

A COP 406 may be defined statically and be in existence permanently. Alternatively, a COP 406 may be created and destroyed dynamically to allow dynamic reconfiguration of the function blocks associated therewith. For example, a COP 406 may be used to incorporate a function block for compression or encryption of all or part of a message stored in the MIS component 402. A COP 406 may be associated with a DC component 407, which points to the beginning of the message in the MIS component 402 to be processed by the COP 406.

A PIP 408 is concerned with enabling the movement of a message to and from soft platform architecture 400. In one embodiment of the invention, a PIP 408 may be used to incorporate a function block, similar to a COP 406. The function block associated with a PIP 408 may comprise a circuit or subsystem defined outside the context of the soft platform architecture 400 that is specifically geared to perform I/O functions. In another embodiment of the invention, a PIP 408 may be implemented as a FSM in programmable logic of the FPGA.

For example, a PIP may be used to receive or transmit successive words of a message over an interface using a protocol defined for the interface. For example, a PIP may act as a smart adapter for the Xilinx® LocalLink interface to a networking core or the interface to a Gigabit MAC core. A PIP may also communicate with other system components implemented within the FPGA.

The SSS component 410 may be used to store state information associated with the processes of the process component 403. For example, the SSS component 410 may be used to store a message context 405 for a FOP 404. The SSS component 410 may be physically implemented using a centralized memory device, a plurality of distributed memory devices, or a combination thereof.

Memory Model

Figure 5:
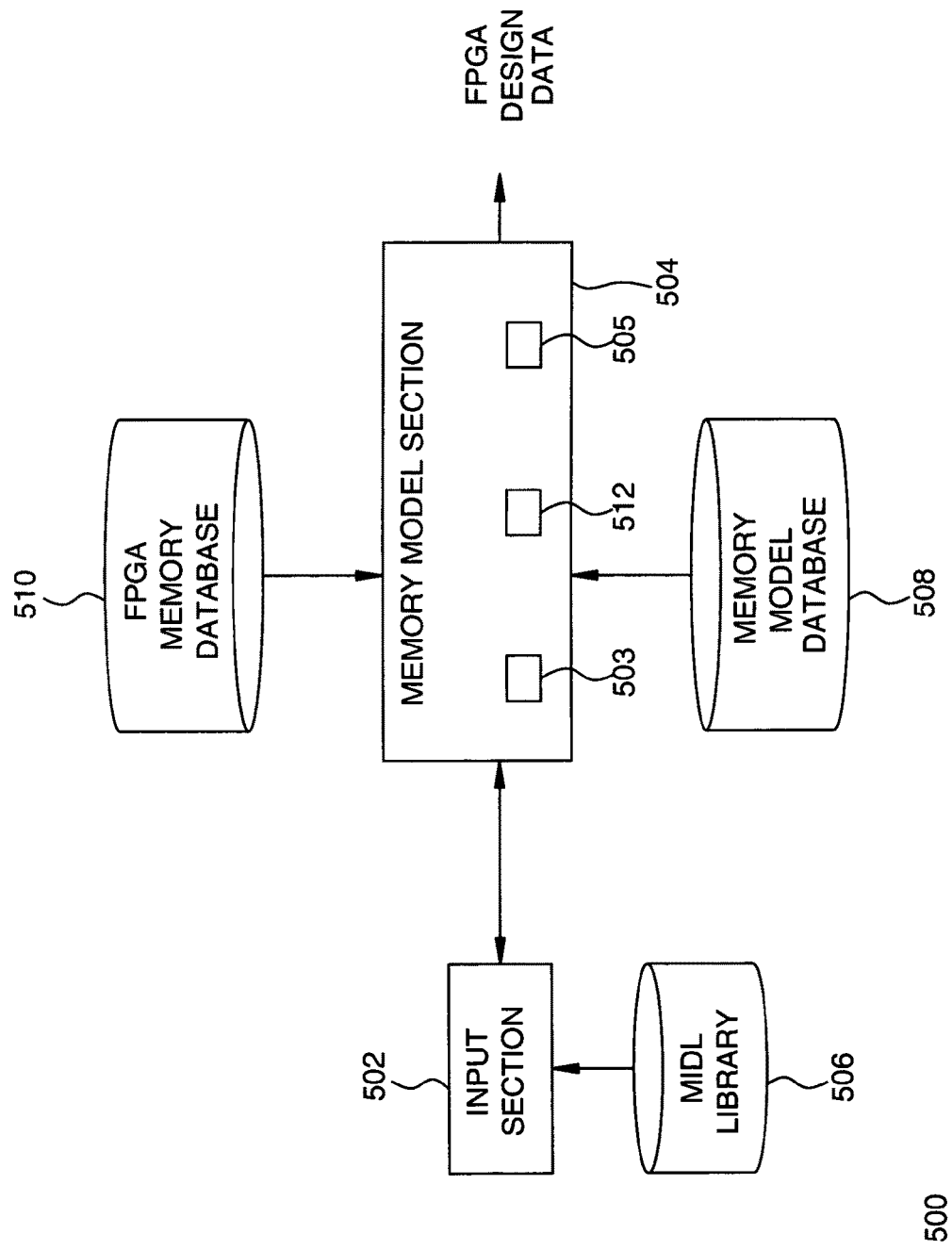
FIG. 5 is a block diagram depicting an exemplary embodiment of a design tool for designing a memory subsystem for implementation using an FPGA.

FIG. 5 is a block diagram depicting an exemplary embodiment of a design tool 500 for designing a memory subsystem for implementation using an FPGA. The design tool 500 comprises an input section 502 and a memory model section 504. The memory model section 504 provides a configurable and programmable memory model for implementing a memory subsystem using an FPGA and, optionally, other memories connected to an FPGA.

In particular, the input section 502 is coupled to a database that stores an API associated with the memory model, referred to herein as the memory interconnection description language (MIDL) library 506. The MIDL library 506 comprises a set of primitives for defining structural and behavioral attributes of the memory model. Thus, the MIDL library 506 provides a programming interface for the memory model. A designer may interact with the input section 502 to produce specification data for a memory subsystem. The designer may work directly with the MIDL library 506, or may work indirectly with the MIDL library 506 through an alternative design tool defined within the input section 502. The memory subsystem specification data may be programmatic or may be interpretive (e.g., XML). An example of an MIDL specification for a 32-bit wide memory constructed from two 16-bit wide memories, which are in turn mapped to physical BRAM in an FPGA, is shown in Appendix A.

The memory model section 504 is coupled to the input section 502 for receiving the memory model specification. The memory model section 504 is also coupled to a database that stores the features or attributes of the memory model ("memory model database 508"), and a database that stores the memory attributes of an FPGA and external memories associated therewith ("FPGA memory database 510"). The memory model section 504 includes a first portion 503 for generating a logical view of a memory subsystem in accordance with the memory subsystem specification. The logical view is defined in terms of the logical components of the memory model stored in the memory model database 508.

The memory model section 504 may include an analysis/optimization portion 512 for analyzing and optimizing the logical view of the memory subsystem in accordance with constraint data provided by a designer. The memory model section 504 further includes a second portion 505 for generating a physical view of the memory system based on the logical view. Notably, using information in the FPGA memory database 510, the memory model section maps the logical view of the memory subsystem onto the physical memory components associated with an FPGA. The memory model section 504 provides FPGA design data as output.

Figure 6:
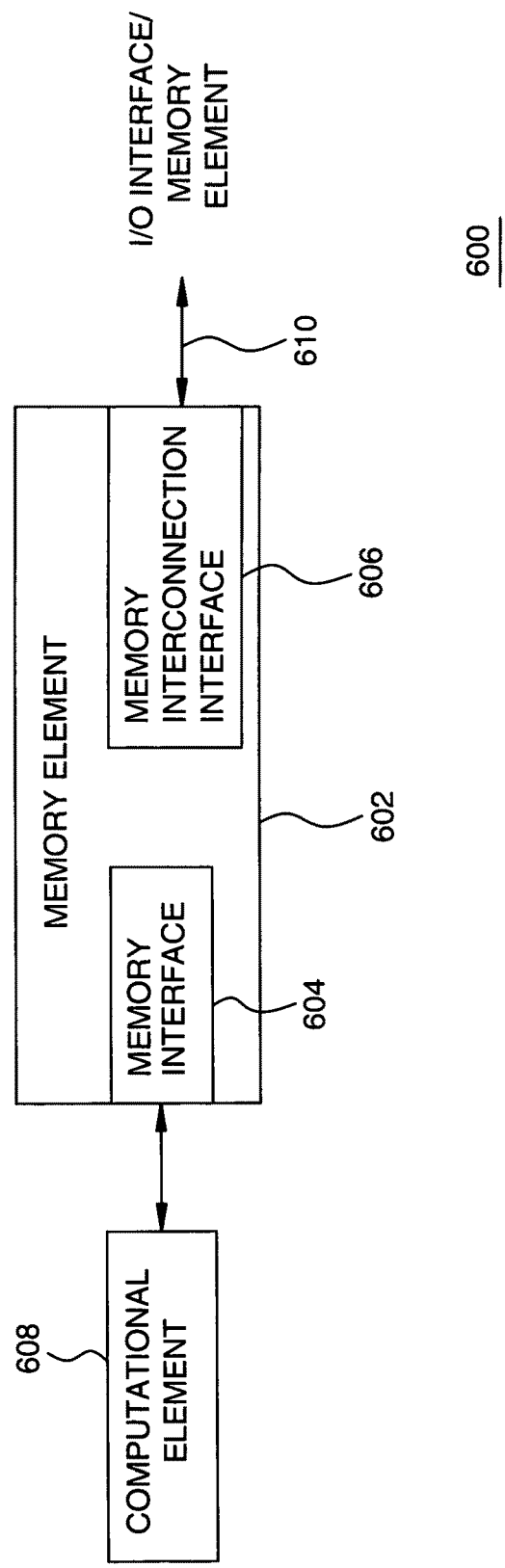
FIG. 6 is a block diagram depicting an exemplary embodiment of a memory model in accordance with one or more aspects of the invention.

FIG. 6 is a block diagram depicting an exemplary embodiment of a memory model 600 in accordance with one or more aspects of the invention. The memory model 600 comprises a memory element 602 having a memory interface 604 and a memory interconnection interface 606. The memory element 602 is a logical component with no implied physical implementation. That is, the memory element 602 may comprise one or more physical memories, disposed within an FPGA and/or external thereto. The memory interface 604 is configured to provide communication between the memory element 602 and a computational element 608 (e.g., one or more threads). For example, the memory element 602 may be configured to store messages, and the computational element may access the messages through the memory interface 604 for processing. The memory interconnection interface 606 is configured to provide communication between the memory element 602 and an interconnection 610. The interconnection 610 may comprise a portal to an I/O interface (e.g., a Gigabit Ethernet MAC core on the FPGA) or to another memory element (either within the FPGA or external to the FPGA). For example, the memory element 602 may be configured to store messages, and the interconnection may receive and transmit messages to and from the memory-interconnection interface 606.

The memory model 600 is characterized by a "memory architecture" and a "memory-interconnection architecture." The memory architecture pertains to the size, type, and topology of one or more memory circuits comprising the memory element 602. The memory-interconnection architecture pertains to the type, bus width (e.g., number of wires), and topology of interconnection (e.g., crossbar) of the one or more memory circuits comprising the memory element 602. In general, with respect to the memory model 600, the term "interface" imparts knowledge related to the protocols that must be adhered to for the particular interaction, whereas the term "architecture" imparts knowledge related to the critical path that particular data follows within the memory model 600.

The memory and interconnection architectures of the memory model 600 may be defined by the physical location of the memory circuits used to implement the model, as well as the logical configuration of the interface to such memory circuits. For example, the memory may be physically centralized (i.e., a single physical memory circuit), or several memory circuits may be physically distributed. The memory circuit(s) used to implement the memory model 600 may be disposed within the FPGA (e.g., any combination of on-chip BRAMs, LUT-based RAMs, and shift registers), disposed external to the FPGA (e.g., external SDRAMs, DDR SDRAMs, and RDRAMs), or a combination thereof. In addition, the interface to such memory circuit(s) may be logically centralized (e.g., a unified programming interface) or logically distributed (e.g., multiple logical interfaces).

Figure 9:
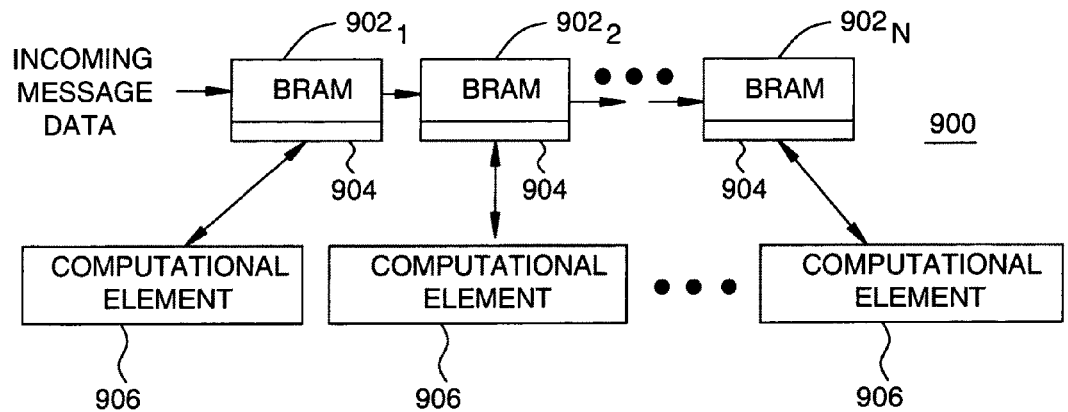
FIG. 9 is a block diagram depicting an exemplary embodiment of a memory subsystem that may be implemented using the memory model of FIG. 6.
Figure 10:
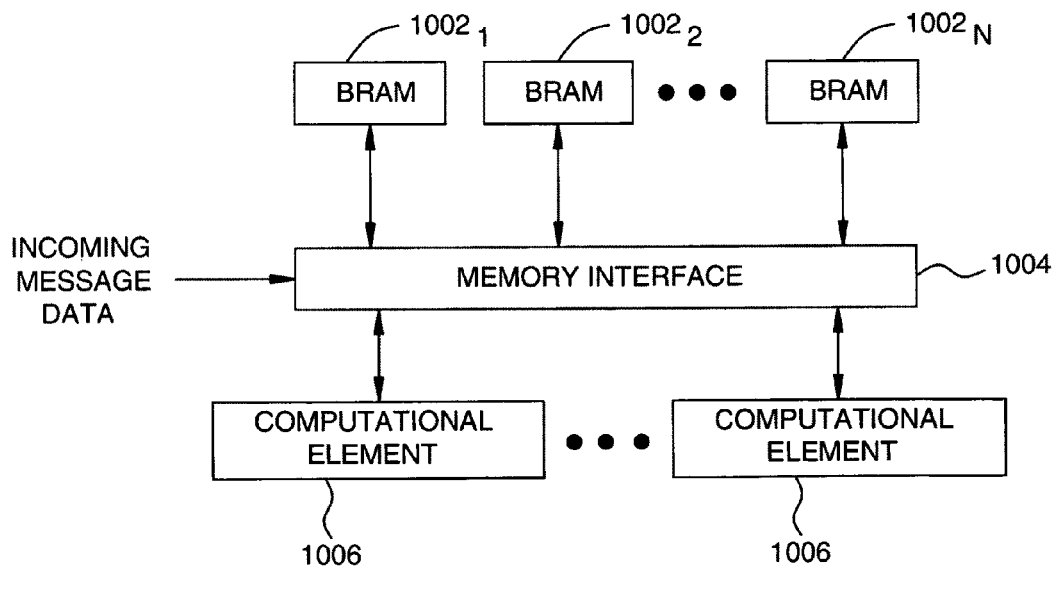
FIG. 10 is a block diagram depicting another exemplary embodiment of a memory subsystem that may be implemented using the memory model of FIG. 6.

In light of the various physical and logical configurations for the memory and interconnection architectures, various logical schemes for storing messages may be implemented using the memory model 600. In one embodiment, all messages may be stored within a single memory (e.g., a queue of messages in a memory) ("uniform message storage"). Alternatively, different messages may be allocated over different memories ("interleaved message storage"). In yet another alternative, each message may be physically allocated over different memories ("striped message storage"). In another embodiment, each message may be logically allocated over different memories ("separated message storage"). FIGS. 9 and 10 depict examples of memory subsystems illustrating exemplary configurations for the memory and interconnection architectures with respect to the storage of messages in a system. Those skilled in the art will appreciate that many other configurations for the memory and interconnection architectures may be employed in accordance with the above attributes, of which FIGS. 9 and 10 are examples.

In particular, FIG. 9 is a block diagram depicting an exemplary embodiment of a memory subsystem 900 that may be implemented using the memory model 600. The memory subsystem 900 illustratively comprises a set of BRAMs $902_1$ through $902_N$, where N is an integer greater than one (collectively referred to as BRAMs 902). The BRAMs 902 may be disposed within an FPGA. Each of the BRAMs 902 includes a memory interface 904. The memory interface 904 of each of the BRAMs 902 is configured for communication with a computational element 906. For example, each of the computational elements 906 may comprise an instance of a process (e.g., a thread) within the soft platform architecture described above. Each of the BRAMs 902 includes a second interface for receiving incoming message data.

Notably, an incoming message may be "striped" across the BRAMs 902 such that each of the BRAMs 902 stores only a portion of the incoming message. Each of the computational elements 906 may then access respective ones of the BRAMs 902 through the respective memory interface 904 to access a portion of the incoming message. The memory subsystem 900 is an example of striped message storage using physically distributed memories within an FPGA.

FIG. 10 is a block diagram depicting another exemplary embodiment of a memory subsystem 1000 that may be implemented using the memory model 600. The memory subsystem 1000 illustratively comprises a set of BRAMs $1002_1$ through $1002_N$, where N is an integer greater than one (collectively referred to as BRAMs 1002). The BRAMs 1002 may be disposed within an FPGA. Each of the BRAMs 1002 includes an interface in communication with a memory interface 1004. The memory interface 1004 includes an interface in communication with a plurality of computational elements 1006. The memory interface 1004 also includes an interface for receiving incoming message data.

The BRAMs 1002 are logically part of one centralized memory with a dedicated memory interface 1004 that manages access to the messages stored in the BRAMs 1002. Each of the computational elements 1006 may access a message or portion thereof through the memory interface 1004. The memory subsystem 1000 is an example of a logically centralized, physically distributed memory organization.

Returning to FIG. 6, the memory and interconnection interfaces in the memory model 600 may be defined in accordance with various configurable attributes, such as the number of ports to a memory and the width of each port. In addition, the memory model 600 may be configured to provide a reactive memory subsystem, such as a cooperative memory subsystem.

Figure 11:
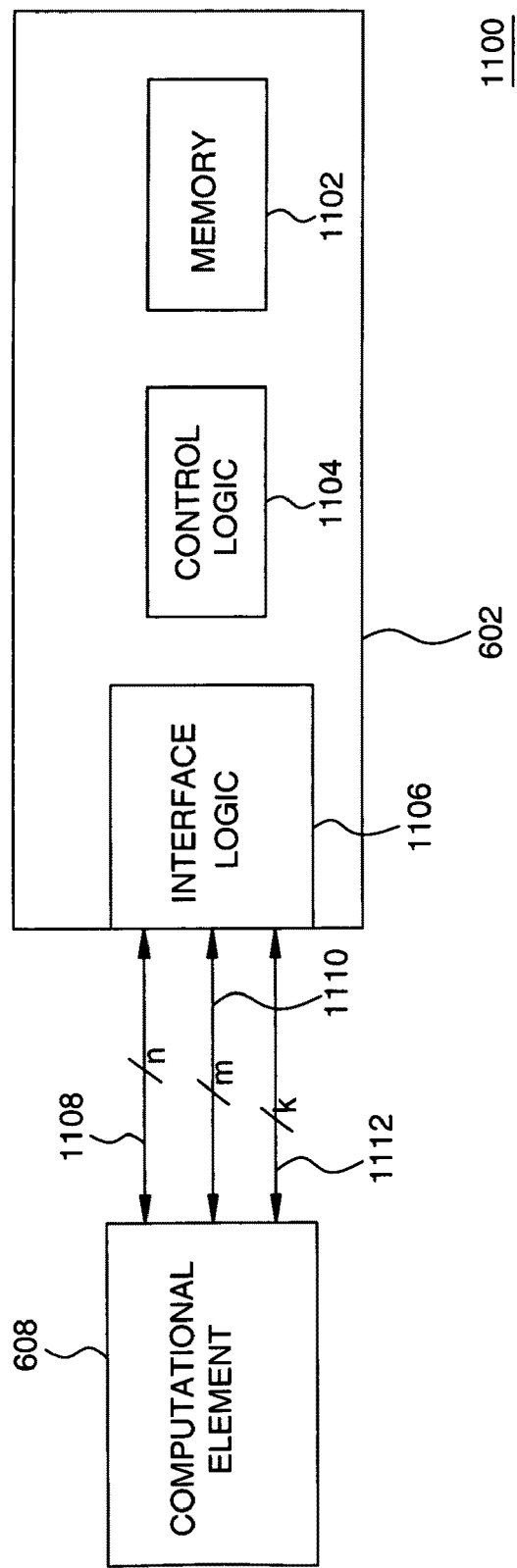
FIG. 11 is a block diagram depicting an exemplary embodiment of a cooperative memory interface that may be implemented using the memory model of FIG. 6.

Notably, FIG. 11 is a block diagram depicting an exemplary embodiment of a cooperative memory interface 1100 that may be implemented using the memory model 600. Cooperative memories are memories that do not just stall or block when data is not available, but rather respond back with a message, such as "data will be available in three cycles." As shown, the memory element 602 comprises a memory 1102, control logic 1104, and interface logic 1106. The interface logic 1106 is coupled to the computational element 608 via a data bus 1108, a control bus 1110, and a status bus 1112. The data bus 1108 has a width of n, the control bus 1110 has a width of m, and the status bus 1112 has a width of k. In general, the width of the control bus 1110 and the width of the status bus 1112 will be much less than the width of the data base 1108. For purposes of clarity by example, the data bus 1108, the control bus 1110, and the status bus 1112 are shown as separate buses. It is to be understood, however, that the data bus 1108, the control bus 1110, or the status bus 1112, or any combination thereof, may be multiplexed within the interface logic 1106 over the same physical bus.

The computational element 608 requests data using the control bus 1110. The control logic 1104 determines whether the data is available within the memory 1102. If so, the data is communicated to the computational element 608 over the data bus 1108. Otherwise, the control logic 1104 generates a status signal for communication to the computational element 608 over the status bus 1112. The status signal may indicate the unavailability of the requested data and an estimated duration after which the data will be available.

Figure 7:
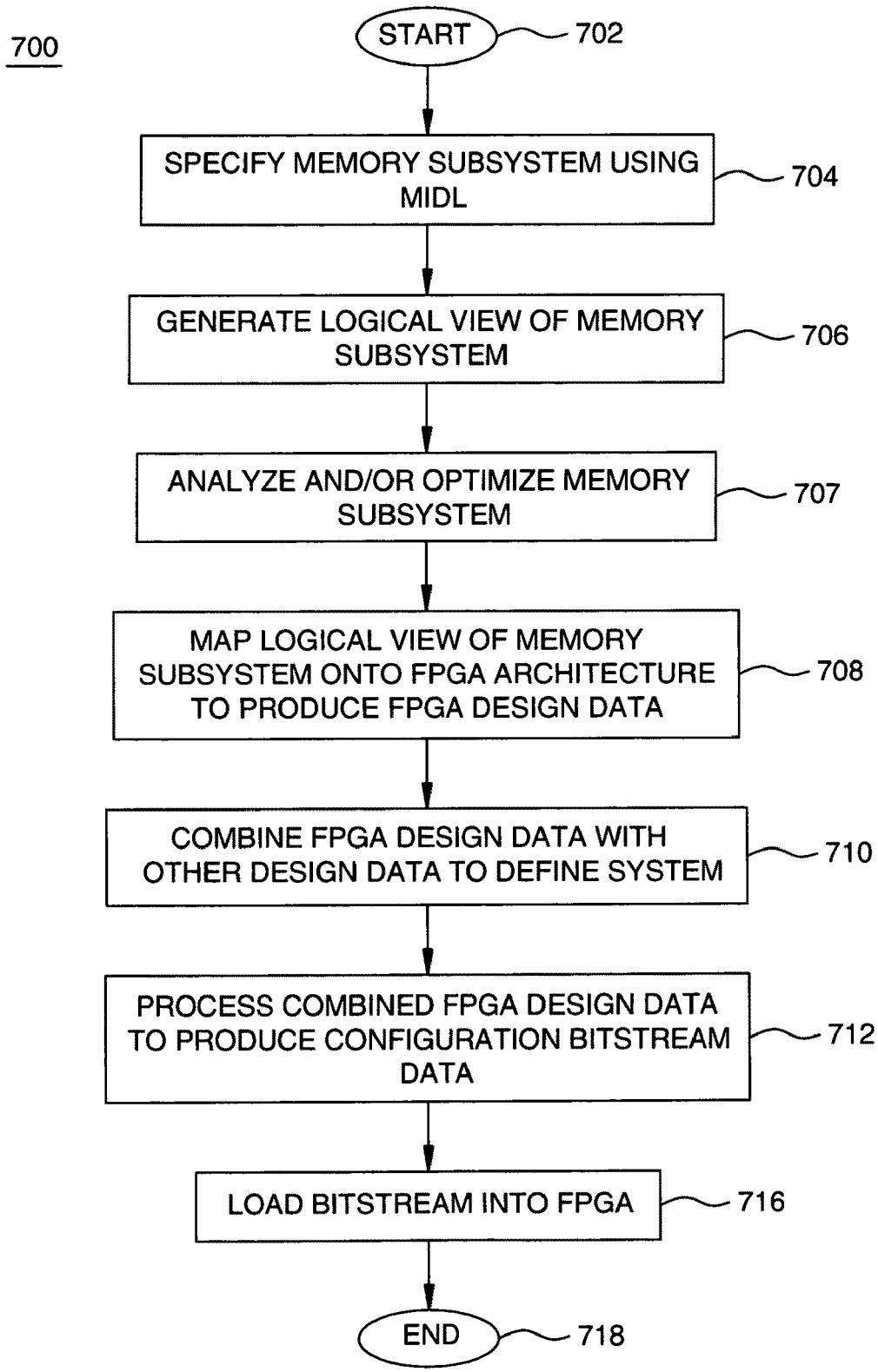
FIG. 7 is a flow diagram depicting an exemplary embodiment of a process for designing a memory subsystem for implementation using an FPGA.

FIG. 7 is a flow diagram depicting an exemplary embodiment of a process 700 for designing a memory subsystem for implementation using an FPGA. The process 700 is described with respect to the memory model 600 of FIG. 6. The process 700 begins at step 702. At step 704, a memory subsystem specification is defined using a MIDL. As described above, the MIDL comprises a set of primitives associated with the logical memory model 600. Notably, the MIDL includes primitives for defining the memory architecture, the memory-interconnection architecture, the memory interface, and the memory-interconnection interface.

At step 706, a logical view of the memory subsystem is generated in accordance with the memory subsystem specification. The logical view is defined in terms of the memory model 600. That is, the logical components of the memory model 600 are configured in accordance with the memory subsystem specification to generate a logical view of the memory subsystem.

At step 707, the memory subsystem may be analyzed and optimized in accordance with predefined constraint and test data. The constraint data may include constraints on memory access, time, and interconnect resources. The test data may include one or more test memory access patterns. In one embodiment of the invention, an analysis model based on memory access, time, and interconnect resources is employed.

Figure 8:
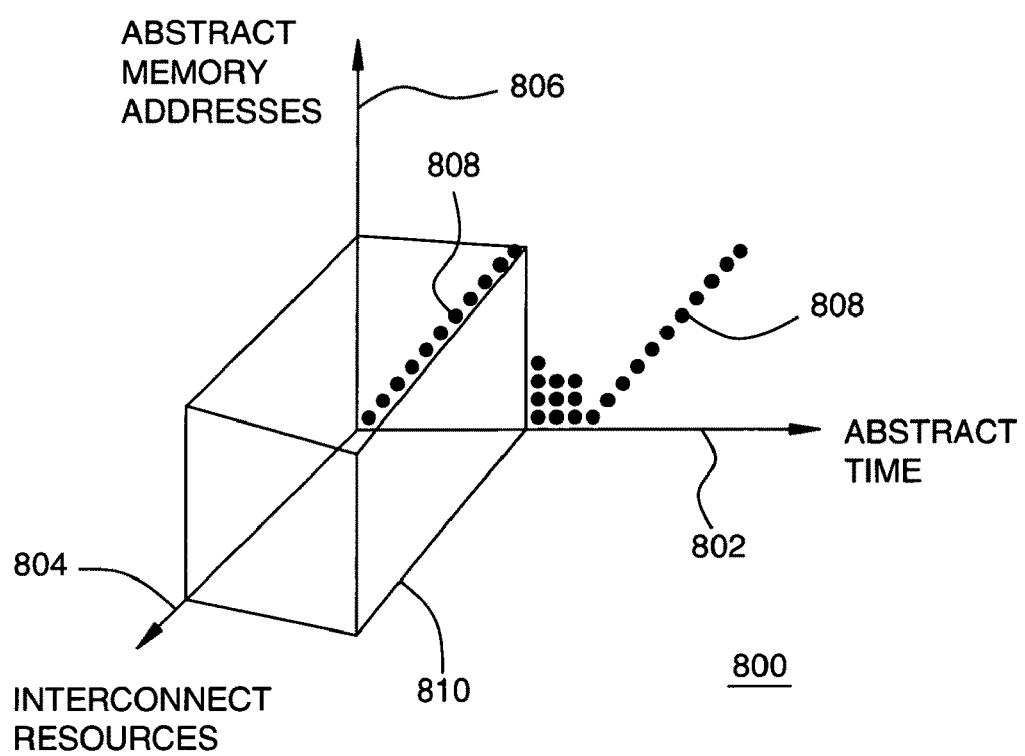
FIG. 8 is a graph illustrating an exemplary embodiment of a memory analysis model.

Notably, FIG. 8 is a graph 800 illustrating an exemplary embodiment of a memory analysis model. The graph 800 includes an axis 802 representing abstract memory addresses, an axis 804 representing abstract time, and an axis 806 representing interconnect resources. The graph 800 depicts an exemplary access pattern comprising a plurality of points 808. Each point 808 signifies a memory access corresponding to a particular memory location (address) at a particular time that utilizes a particular interconnect resource. For example, the exemplary access pattern may result from a burst of packets entering the memory subsystem, followed by some header manipulation, and a burst of packets exiting the memory subsystem. The predefined constraint data is shown superimposed over the graph 800 as a cuboid 810. If all points 808 are within the cuboid 810, the access pattern is valid. Otherwise, an optimization is required to satisfy the constraints.

Returning to FIG. 7, at step 708, the logical view of the memory subsystem is mapped onto an FPGA architecture to produce FPGA design data. That is, the logical components comprising the logical view are linked to physical memory components of an FPGA and, optionally, other memory devices connected to the FPGA. The FPGA design data provides a physical view of the specified memory subsystem in terms of the memory architecture of the FPGA. That is, FPGA design data corresponds to the physical implementation of the logical view of the memory subsystem defined using the MIDL. In one embodiment of the invention, the FPGA design data comprises an HDL representation of the MP system design.

At step 710, the FPGA design data may be combined with other FPGA design data to define a system. For example, the memory subsystem may be incorporated into an MP system designed as described above in the section entitled "SOFT PLATFORM." That is, the memory subsystem may be the implementation of the MIS component of the soft platform architecture used to implement an MP system.

At step 712, the combined FPGA design data is processed to produce configuration bitstream data. For example, if the combined FPGA design data comprises an HDL representation, the FPGA design data may be synthesized, mapped, placed, and routed in a well-known manner to produce bitstream data for configuring an FPGA. At step 716, the configuration bitstream data is loaded into an FPGA. The process 700 ends at step 718.

Multithread Model

Figure 12:
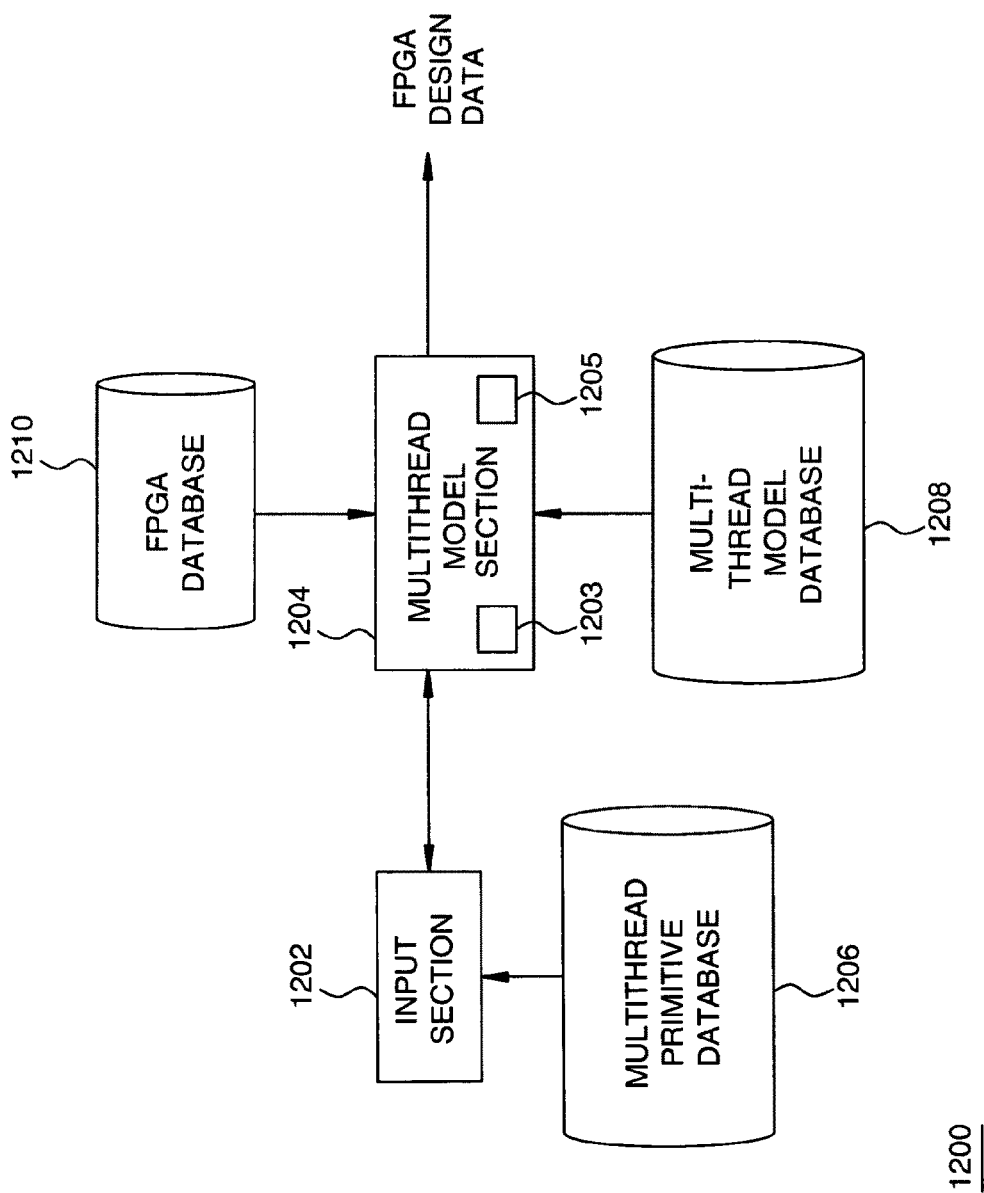
FIG. 12 is a block diagram depicting an exemplary embodiment of a design tool for designing a multithread model for implementation using an FPGA.

FIG. 12 is a block diagram depicting an exemplary embodiment of a design tool 1200 for designing a multithread model for implementation using an FPGA. The design tool 1200 comprises an input section 1202 and a multithread model section 1204. The multithread model section 1204 provides a configurable and programmable multithread model for implementing multiple threads using an FPGA. As used herein, the term "thread" is a concurrent execution unit appropriate for implementing a process, such as some of the processes described above with respect to the soft platform architecture (e.g., FOPs and PIPs). The multithread model employs a synchronization mechanism for controlling the various threads thereof and, in some embodiments, passing data therebetween.

In particular, the input section 1202 is coupled to a database that stores a library of multithreading primitives ("multithread primitive database 1206"). The multithread primitive database 1206 stores a set of primitives for defining structural and behavioral attributes of the multithread model. Thus, the multithread primitive database 1206 provides a programming interface for the multithread model. Notably, the multithread primitive database 1206 includes primitives for starting a thread, stopping a thread, suspending a thread, as well as synchronization of such starting, stopping, and suspending among threads. In addition, primitives are provided for indicating status information for individual threads, such as completion or suspension, among other threads. Furthermore, primitives may be provided for allowing data communication among threads.

A designer may interact with the input section 1202 to produce specification data for a multithreading system. The designer may work directly with the multithread primitive database 1206, or may work indirectly with the multithread primitive database 1206 through an alternative design tool defined within the input section 1202. The multithreading system specification data may be programmatic or may be interpretive (e.g., XML).

The multithread model section 1204 is coupled to the input section 1202 for receiving the multithreading system specification data. The multithread model section 1204 is also coupled to a database that stores the features or attributes of the multithread model ("multithread model database 1208"), and a database that stores the physical attributes of an FPGA ("FPGA database 1210"). The multithread model section 1204 includes a first section 1203 for generating a logical view of the multithreading system in accordance with the multithreading system specification. The logical view is defined in terms of the logical components of the multithread model stored in the multithread database 1208. The multithread model section 1204 includes a second portion 1205 for generating a physical view of the multithreading system based on the logical view. Notably, using information in the FPGA database 1210, the multithread model section 1204 maps the logical view of the multithreading system onto the physical components associated with an FPGA. The multithread model section 1204 provides FPGA design data as output.

Figure 13:
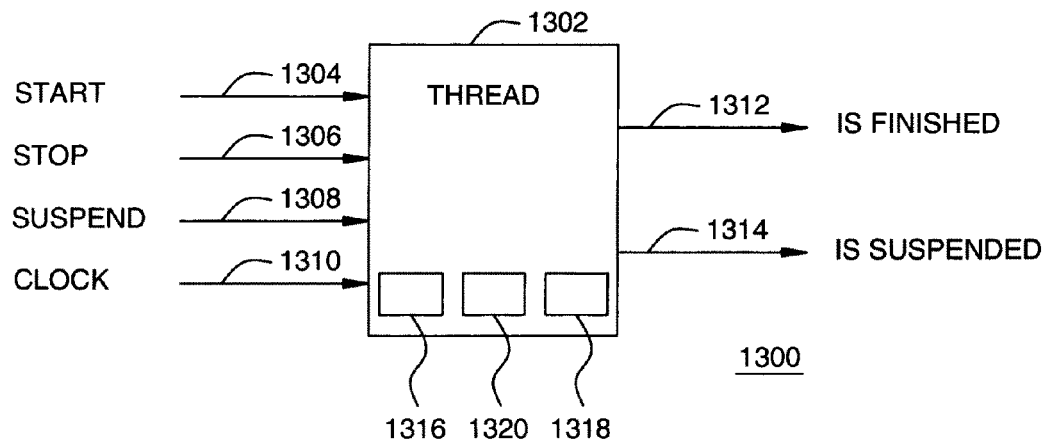
FIG. 13 is a block diagram depicting an exemplary embodiment of a thread model in accordance with one or more aspects of the invention.

FIG. 13 is a block diagram depicting an exemplary embodiment of a thread model 1300 in accordance with one or more aspects of the invention. The thread model 1300 comprises a thread 1302 having a start terminal 1304, a stop terminal 1306, a suspend terminal 1308, a clock terminal 1310, an isFinished terminal 1312, and an isSuspended terminal 1314. The start terminal 1304, the stop terminal 1306, and the suspend terminal 1308 comprise an input bus of the thread 1302 for controlling operation thereof. The isFinished terminal 1312 and the isSuspended terminal 1314 comprise an output bus of the thread 1302 for conveying status information related to the thread 1302. As described below, the output bus of the thread 1302 may include other portions for communicating signals amongst threads. The thread model 1300 is a logical component with no implied physical implementation. An example interface in VHDL for a thread is shown in Appendix B.

Notably, the thread model 1300 may be physically implemented in programmable logic of an FPGA as a synchronous FSM. That is, a clock drives the state machine's transitions and, within each state of the state machine, operations are performed on operands producing outputs. In another embodiment, the thread model 1300 may be implemented using a microcontroller embedded within an FPGA. In yet another embodiment, the thread model 1300 may be implemented using a hard or soft microprocessor embedded within an FPGA.

The thread 1302 includes control logic 1320 for processing data and producing control state data 1316 and operation state data 1318. The control state data 1316 captures the state of the thread 1302 in terms of inter-thread communication (e.g., the thread is finished or suspended). The operation state data 1318 captures the internal state of the thread 1302, which is defined in accordance with the operation of the control logic 1320.

In one embodiment of the invention, the thread 1302 includes an IDLE control state that corresponds to the thread 1302 not currently carrying out any operation. During the IDLE control state, the isFinished terminal 1312 is asserted to indicate that the thread 1302 is not doing any work. If the start terminal 1304 is asserted, the thread 1302 moves out of the IDLE control state and performs the various operations that the thread 1302 is configured to perform. The isFinished terminal 1312 is no longer asserted to indicate that the thread 1302 is in operation. Asserting the stop terminal 1306 returns the thread 1302 to the IDLE control state, terminating all operations. Asserting the suspend terminal 1308 causes the thread 1302 to remain in its current operation state, regardless of how many clock cycles occur on the clock terminal 1310. The suspend terminal 1308 may be used during debugging or testing through an external agent. The isSuspended terminal 1314 is asserted while the thread 1302 is suspended.

The operation state data 1318 depends on the operational configuration of the control logic 1320 of the thread 1302 in accordance with specification data provided by a designer. That is, the control logic 1320 of the thread 1302 is configured to execute a series of steps, where one or more operations are performed at each step. In one embodiment, the thread 1302 may be designed to have one or more designated terminal operation states that cause the thread 1302 to enter the IDLE control state and assert the isFinished terminal 1312. Alternatively, there may be no such designated terminal control states, in which case the thread is control externally by asserting the stop signal.

For example, a VHDL code fragment for implementing the thread 1302 may be:

update: process (clk, stopThread)
begin—process update
  if stopThread='1' then
    state<=idle;
  elsif clk'event and clk='1' and suspendThread='0' then
    state<=nextState;
  end if;
end process update;

where the thread 1302 is implemented as a state machine. In this example, the IDLE control state is implemented as an extra state added to the internal operation state set of the thread. While there is no explicit suspend control state, the suspend mechanism may be implemented by driving the suspend terminal 1308 to prevent the calculated nextState from being latched into the state machine's register. Thus, the thread will remain in the current operation state, with no forward progress. For purposes of clarity by example, the implications for the values of outputs from the state are not shown explicitly in the above exemplary VHDL code fragment.

The thread 1302 has thus far been described with respect to an external agent that asserts the start, stop, and suspend terminals. The "external agent" may be another thread, thus allowing threads to control other threads. In order to enable one thread to write or read the signals of another thread, the multithread model employs an interconnection topology and an addressing mechanism. That is, a plurality of threads are interconnected for communication amongst themselves, and a thread may associate the address of another thread with its collection of input and output signals.

Figure 14:
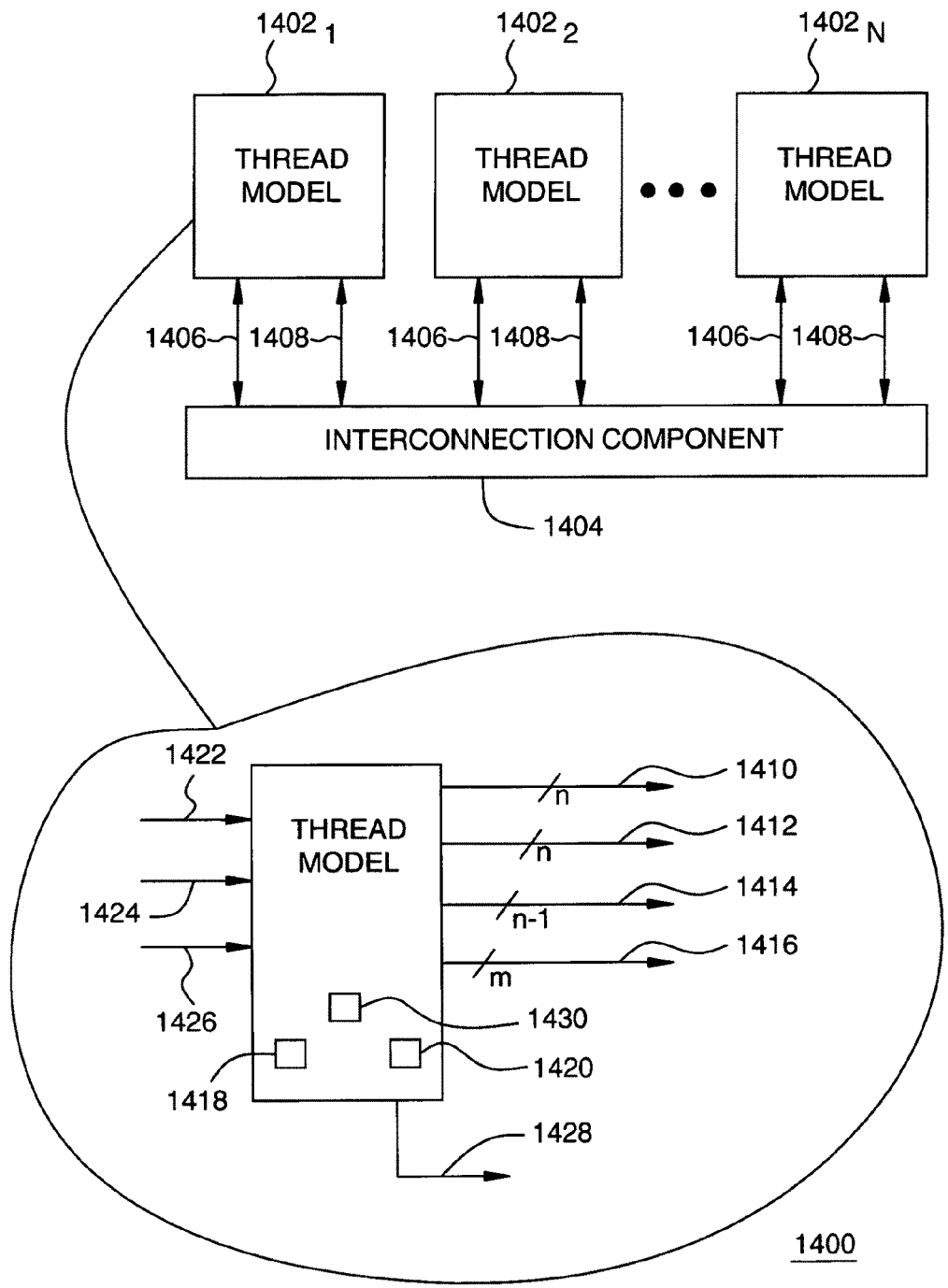
FIG. 14 is a block diagram depicting an exemplary embodiment of a multithread model in accordance with one or more aspects of the invention.

Notably, FIG. 14 is a block diagram depicting an exemplary embodiment of a multithread model 1400 in accordance with one or more aspects of the invention. The multithread model 1400 comprises a set of thread models $1402_1$ through $1402_N$, where N is an integer greater than one (collectively referred to as thread models 1402). The multithread model 1400 also includes an interconnection component 1404. Each of the thread models 1402 includes an input bus 1406 and an output bus 1408. The input bus 1406 and the output bus 1408 of each of the thread models 1402 are in communication with the interconnection component 1404. In one embodiment, the interconnection component 1404 facilitates complete point-to-point communication of control, status, and/or data among the thread models 1402.

In one embodiment of the invention, the output bus 1408 of a thread model 1402 comprises a start control bus 1410, a stop control bus 1412, a suspend control bus 1414, and a status bus 1416. The width of each of the start control bus 1410 and the stop control bus 1412 is N (i.e., the number of thread models 1402 in the multithread model 1400). The width of the suspend control bus 1414 may be N–1 if self-suspension of a thread is not defined. The status bus 1416 may comprise M status signals (e.g., isFinished and isSuspended signals) and thus the width of the status bus 1416 is M. The input bus 1406 of a thread model 1406 comprises a start terminal 1422, a stop terminal 1424, and a suspend terminal 1426.

In one embodiment of the invention, each of the thread models 1402 produces a control signal for each of the other thread models 1402 (e.g., thread model $1402_1$ produces control signals for thread models $1402_2$ through $1402_N$) through operation of control logic 1430. Thus, if there are eight thread models 1402 in the multithread model 1400, then each thread model 1402 will produce eight start signals, eight stop signals, and seven suspend signals in accordance with the control logic 1430. For each of the thread models 1402, start signal and one stop signal is connected in a self-loop, which allows a thread model 1402 to start and stop itself. The interconnection component 1404 facilitates the connection between the output bus 1408 of a given thread model and the input buses of each of the other thread models.

Figure 15:
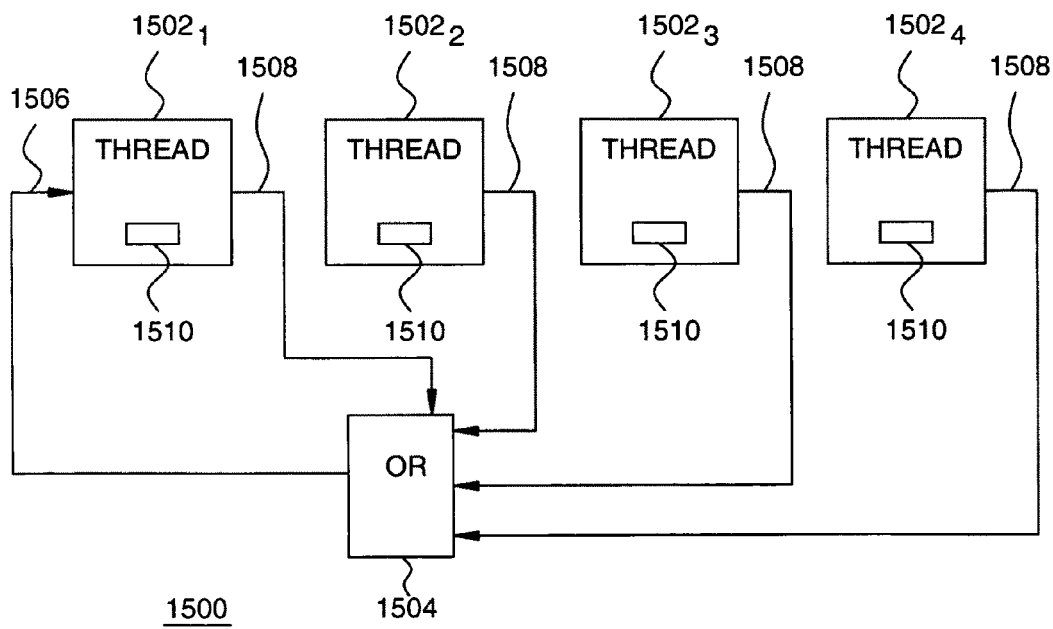
FIG. 15 is a block diagram depicting an exemplary embodiment of a multithread system that may be implemented using the multithread model of FIG. 14.

FIG. 15 is a block diagram depicting an exemplary embodiment of a multithread system 1500 that may be implemented using the multithread model 1400. The multithread system 1500 illustratively comprises four threads $1502_1$ through $1502_4$ (collectively referred to as threads 1502) and a logical OR component 1504. The thread $1502_1$ includes a start terminal 1506 for providing an input start signal to the thread $1502_1$. An output of the OR component 1504 is coupled to the start terminal 1506. Each of the threads 1502 includes a start control terminal 1508 for providing output start control signals. Inputs of the OR component 1504 are coupled to the start control terminals 1508 of the threads 1502. Each of the threads 1502 includes control logic 1510 for controlling the assertion of their respective start control terminal 1508.

Notably, if it is not intended that a particular one of the threads 1502 control the starting of the thread $1502_1$, then the start control terminal 1508 is not asserted. If one of the threads 1502 intends to start the thread $1502_1$, the start control terminal 1508 of that thread is asserted. For example, if the thread $1502_3$ intends to start the thread $1502_1$, then the thread $1502_3$ asserts its start control terminal 1508. The start control terminals 1508 are logically OR-ed together by the OR component 1504 such that if one or more is asserted, the thread $1502_1$ will be started. For purposes of clarity by example, a synchronization mechanism for starting the thread $1502_1$ is shown. It is to be understood, however, that the multithread system 1500 may be extended to start, stop, and suspend any number of threads.

Returning to FIG. 14, the output bus 1408 of a thread model 1402 may include a data bus 1428. Data may be communicated amongst the thread models 1402 through the interconnection component 1404. In one embodiment of the invention, the data bus 1428 may comprise a bus for each of the thread models 1402 in the multithread model 1400. For example, if the thread model $1402_1$ intends to send data to the thread model $1402_2$, then the thread model $1402_1$ communicates the data over the bus associated with the thread model $1402_2$. The validity of the data may be assured by timing, with each of the thread models 1402 designed such that the consumer of the data does not access the data until it has been written. Alternatively, a validity flag 1418 may be employed to indicate valid data.

In yet another embodiment, each of the thread models 1402 may include an identifier 1420 (e.g., a memory address). A pull mechanism may be employed to retrieve data from one thread model using another thread model. A thread model 1402 requiring data provides the identifier to the thread model 1402 in possession of the data, together with a read request, and the data item is provided after some latency. In yet another embodiment, a push mechanism may be employed, whereby once a thread model 1402 has data, it pushes the data to all threads that are known to require the data, together with its identifier 1420.

Programming Interface

Figure 16:
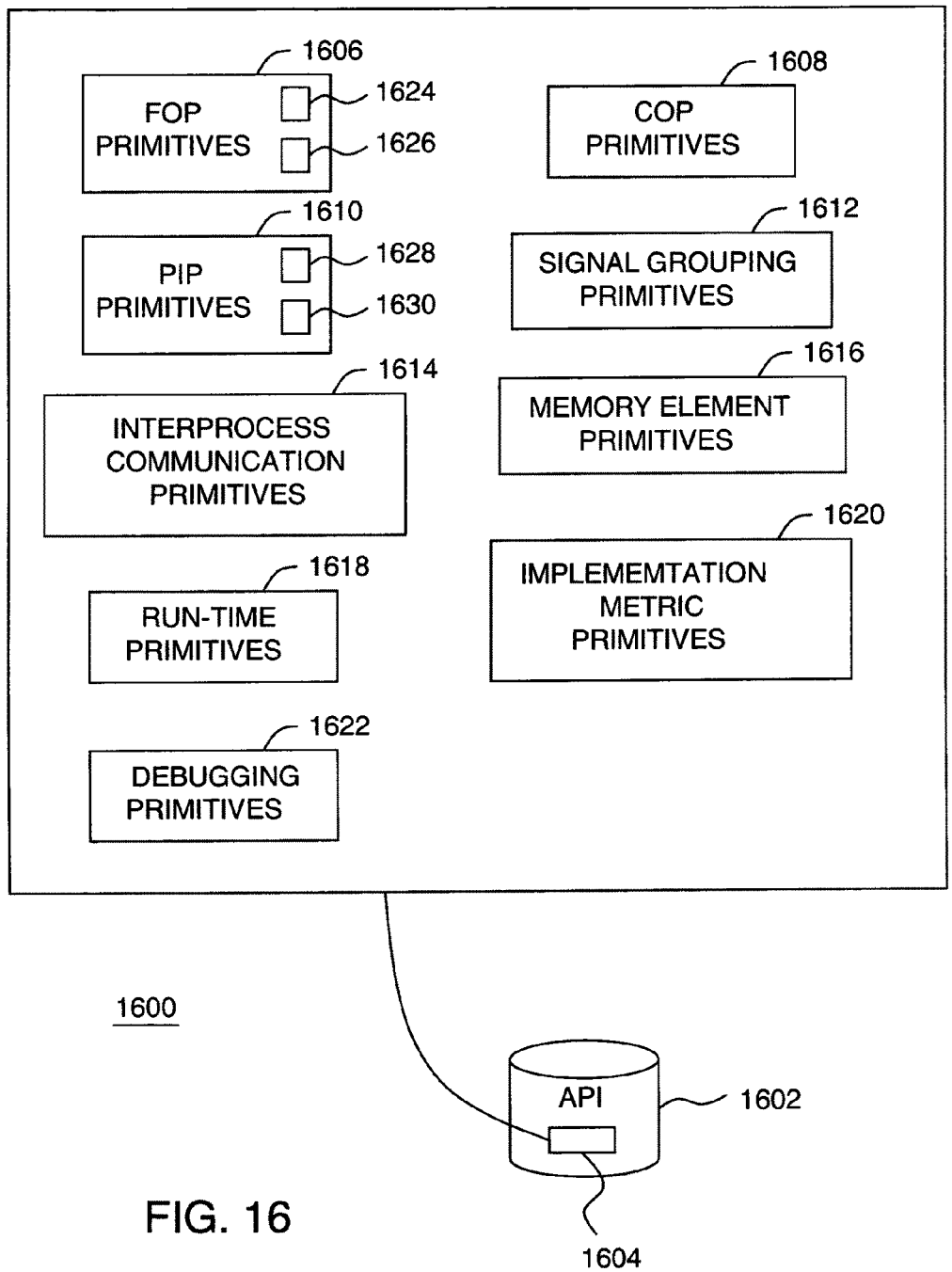
FIG. 16 is a block diagram depicting an exemplary embodiment of a programming interface for the soft platform architecture described herein.

FIG. 16 is a block diagram depicting an exemplary embodiment of a programming interface 1600 for the soft platform architecture described above. The programming interface 1600 comprises an API 1602. The API 1602 comprises a set of primitives 1604 for configuring the soft platform architecture in accordance with a design specification. In one embodiment, the primitives of the API 1602 are programming instructions or program code (e.g., function calls) for interacting programmatically with the soft platform architecture. In another embodiment, the primitives of the API 1602 are interpretive instructions that may be interpreted by the soft platform architecture. For example, a textual representation may be used to convey the design specification data to the soft platform architecture, such as XML. As is well-known in the art, XML exhibits a standardized format and a number of available parsers. The document type definition (DTD) is a formal grammar to specify the structure and permissible values in the XML document. Thus, the API 1602 may include a defined DTD that is specific to the various programmable features of the soft platform architecture.

In one embodiment of the invention, the set of primitives 1604 comprises FOP primitives 1606, COP primitives 1608, PIP primitives 1610, signal grouping primitives 1612, inter-process communication primitives 1614, memory element primitives 1616, run-time primitives 1618, implementation metric primitives 1620, and debugging primitives 1622. Each of the aforementioned primitives is discussed in detail below.

The FOP primitives 1606 provide a coding environment targeting multiple threads that operate in parallel. The FOP primitives 1606 include instruction set primitives 1624 and physical implementation primitives 1626. The instruction set primitives 1624 are used to program the threads. That is, the instruction set primitives 1624 provide a mechanism for establishing an instruction set of a thread, where the instruction set itself is programmable. Thus, a designer may modify an instruction set for a thread as desired (e.g., providing a domain-specific set of instructions). The physical implementation primitives 1626 are used to define the physical implementation of a given thread. For example, a thread may be implemented in programmable logic of an FPGA or in a hard or soft microprocessor or using a microcontroller.

In one embodiment, each thread is implemented as a custom FSM in programmable logic of an FPGA. An instruction set is defined for the FSM thread, where each instruction has a dedicated implementation. There is no additional support required for unused operations in the instruction set and multiple instructions may be executed simultaneously.

The COP primitives 1608 are used to include a function block into the design. In one embodiment, the COP primitives 1608 comprise "include" type primitives for specifying a particular function block to include within the design.

The PIP primitives 1610 may comprise instruction set primitives 1628 and physical implementation primitives 1630. The instruction set primitives 1628 are used to define an instruction set for a thread in a similar manner to the FOP primitives 1606 described above. Unlike the FOP primitives 1606, however, the instruction set primitives 1628 may be used to define certain system instructions. The system instructions are used to communicate with input/output interface logic blocks that communication with another system (within the FPGA or external thereto). For example, an interface logic block may be a gigabit Ethernet MAC core. The instruction set primitives 1628 provide support for different communication protocols to read/write data over various interfaces. For example, one type of interface may be completely streaming, with data arriving at every clock cycle. Another type of interface may have flow control, where there may be a pause in the data stream.

The physical implementation primitives 1630 define the physical implementation of the PIP (e.g., FSM, microprocessor). The PIP primitives 1610 may also comprise include type primitives for specifying the inclusion of the interface function block. Each interface block may have multiple ports, or groups of signals, associated therewith. One group of signals contains the connectivity to the external environment. The others connect to one or more PIP threads. For example, an interface block may have a set of signals that form a receive port and another set of signals that form a transmit port. In this case, the signals may be grouped together such that each port is assigned to a different PIP thread.

The signal grouping primitives 1612 are used to define signal groups. Grouping of signals may occur in various contexts, such as when connecting an interface block to a PIP thread, as described above, or when connecting to a memory element. In such cases, the programming information for an element such as a FOP thread states that the FOP thread is connected to another element.

The inter-process communication primitives 1614 provide support for synchronization and data communication between threads. Some basic aspects of the mechanism, such as support for starting, stopping, and suspending processes, may be built into the soft platform architecture. Thread synchronization and data communication, however, may be completely specified by a designer. In one embodiment, connections are explicitly specified between processes. Alternatively, required connections may be inferred from the operations defined for a particular group of processes. For example, an operation to start another process may have the form of "START(process)" or an operation to pass a data value to another process may have the form of "PASS(data, destination process)." With such an operation, a connection may be inferred without a designer explicitly defining the connection.

The memory element primitives 1616 are used to define the various types, sizes, and interconnections of memory elements. The memory element primitives 1616 may include the MIDL primitives discussed above in the section entitled "MEMORY MODEL," for specifying the logical view of a memory subsystem.

The run-time primitives 1618 may be used to apply run-time reconfiguration. Run-time reconfiguration involves the modification of a circuit implemented within an FPGA at run-time. Dynamic reconfiguration for an FPGA is well-known in the art. For example, the run-time primitives 1614 may be used to migrate functionality between programmable logic and an embedded processor. Initially, some functionality is implemented in programmable logic with other functionality implemented using an embedded microprocessor. Implicitly, the programmable logic implementation exhibits higher performance than the processor implementation. Functionality may be offloaded to the processor to save area within the programmable logic. During execution, statistics may be taken to give feedback on the chosen partition. A reconfiguration controller determines a new partition and reconfigures the FPGA. An exemplary decision condition would be based on the frequency of events. More frequency events may thus be handled in programmable logic, with less frequency events handled by the embedded processor.

The implementation metric primitives 1620 may be used to define the requirements of the system. For example, the implementation metric primitives 1620 may be used to establish performance requirements that must be met. The implementation metric primitives 1620 may be used to create constraints files (e.g., timing constraint files) that can be used by FPGA design tools (e.g., map/place/route tools). The implementation metric primitives may also provide low-level optimizations (e.g., clock frequency requirements, throughput latency requirements), as well as high-level optimizations (e.g., optimize for area, throughput, latency, power, and the like).

The debugging primitives 1622 may be used to provide debugging capabilities. The debugging primitives 1622 may be used to capture simulated data associated with the soft platform architecture. For example, instead of presenting signal waveforms to the designer, the debugging primitives 1622 allow for data presentation in a more abstracted form. The debugging primitives 1622 also provide lower-level functions through the use of tags or commands that cause the circuitry to be modified and operate in a debug mode.

Appendix C shows exemplary XML code that defines interface logic for a logic block or "core," referred to as "Aurora," which may be used to drive the soft platform architecture described herein. The Aurora interface, available from Xilinx® of San Jose, Calif., is implemented as external intellectual property for point-to-point communication over multi-gigabit transceivers. The first set of signals (clk, reset, RXN, RXP, TXN, and TXP) represent the signals that connect to the external environment. In this example, the data lines would be tied to serial transceivers. The port labeled "rx" is the receive port and has several signals associated therewith. Similarly, the port labeled "tx" is the transmit port and also has several signals associated therewith.

Within each port is a clock associated therewith. The clock determines the clock domain. In the present example, both "rx" and "tx" ports have an output clock. Thus, the IP function block has circuitry to generate a clock signal. This clock would drive all threads in the determined clock domain. Alternatively, a "useclk" tag may be used if the IP block does not generate a clock signal. The clock that drives the port is also used to drive other threads in the clock domain.

Appendix D illustrates an exemplary XML code of a PIP thread that handles the receive-side connection to the Aurora interface defined in Appendix C. The PIP thread reads data from the receive port of the Aurora interface and stores the data in a buffer. The protocol for the interface includes flags marking the state of a frame, end of frame, and whether data is valid. The data valid (RXSourceReadyBar) signal allows the stream to pause. The PIP thread waits until the entire frame has been received before committing the frame to memory. Committing the frame to memory is an indicating mechanism informing the buffer that an entire frame is in memory. This ensures that other blocks of logic that read from the memory do not process a partial frame.

Line 2 of Appendix D illustrates that the PIP thread connects to the A port of a memory named "a2e_buf." Line 3 of Appendix D shows that the PIP thread also connects to the rx port of the interface block named Aurora (as shown in Appendix C). Lines 4-8 of Appendix D define the variables of the PIP thread. In the present example, only internal variables are shown, but variables may also be defined to connect to other threads.

Appendix E illustrates exemplary XML code for effecting an explicit connection. A thread named "sender" having an output named "myout" is defined. Threads named "receiver_1" and "receiver_2", each with an input named "myin," are also defined. The defined connection will connect the output of the sender thread with the two input ports of the receiver threads.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

APPENDIX A

```
MEMORY top
{
  ARCHITECTURE
  {
  CONNECT  MEMINTERFACE  (Mem1),  MEMICINTERFACE (top);
  CONNECT  MEMINTERFACE  (Mem2),  MEMICINTERFACE (top);
  }
MEMINTERFACE
  {
  PORT E(RW, 32);
  CONTROL { };
  }
MEMICINTERFACE
  {
  PORT C(RW, 16);
  PORT D(RW, 16);
  CONTROL { };
  }
MEMORY Mem1
{
  ARCHITECTURE
  {
  TYPE BRAM;
    SIZE 18K;
  }
  MEMINTERFACE
  {
    PORT A(RW, 16);
    CONTROL { };
  }
  MEMICINTERFACE
  {
  }
}
MEMORY Mem2
{
  ARCHITECTURE
  {
    TYPE BRAM;
    SIZE 18K;
  }
  MEMINTERFACE
  {
    PORT B(RW, 16);
    CONTROL { };
  }
  MEMICINTERFACE
  {
  }
}
```

APPENDIX B

```
entity IPv4_handler is
generic (
TID: integer:=IPv4_HANDLER_TID);
port (
clk: in std_logic;
   Control for this Thread
startThread: in std_logic;
stopThread: in std_logic;
suspendThread: in std_logic;
   Status for this Thread
threadIsBlocked: out std_logic;
threadIsFinished: out std_logic;
   Control and Status for Other Threads
isFinished: in std_logic_vector((NUM_THREADS—1) downto 0);
start: out std_logic_vector((NUM_THREADS—1) downto 0);
stop: out std_logic_vector((NUM_THREADS—1) downto 0);
suspend:  out  std_logic_vector((NUM_THREADS—2) downto 0);
is Blocked: in std_logic_vector((NUM_THREADS—1)
``` downto 0));

APPENDIX C

```
<hook name="aurora">
  <!--input clock-->
  <clk name="clk"/>
  <reset name="reset"/>
  <input name="RXN" width="1"/>
  <input name="RXP" width="1"/>
  <output name="TXN" width="1"/>
  <output name="TXP" width="1"/>
<port name="rx">
  <!--output clock-->
  <clk name="rxclk"/>
  <output name="RXdata" width="16" order="ascending"/>
  <output name="RXrem" width="1"/>
  <output name="RXstartofFrameBar" width="1"/>
  <output name="RXendofFrameBar" width="1"/>
  <output name="RXsourceReadyBar" width="1"/>
</port>
<port name="tx">
  <!--output clock-->
  <clk name="txclk"/>
  <input name="TXdata" width="16" order="ascending"/>
  <input name="TXrem" width="1"/>
  <input name="TXstartofFrameBar" width="1" default="1"/>
  <input name="TXendofFrameBar" width="1" default="1"/>
  <input name="TXsourceReadyBar" width="1" default="1"/>
  <output name="TXdestReadyBar" width="1"/>
</port>
</hook>
```

APPENDIX D

```
1: <FSM name="aurora_rx_thread">
2: <usemem name="a2e_buf" port="a"/>
3: <usehook name="aurora" port="rx"/>
4: <variables>
5: <variable name="count" type="internal" width="16"/>
6: <variable name="writes" type="internal" width="16"/>
7: <variable name="myaddress" type="internal" width="16"/>
8: </variables>
9: <states start="startState">
10: <state name="startState">
11: <operation op="ASSIGN" params="count, 0"/>
12: <operation op="ASSIGN" params="writes, 0"/>
13: <operation op="ASSIGN" params="myaddress, 0"/>
14: <conditional>
15:    <condition cond="EQUAL" params="RXstartofFrameBar, 0">
16: <transition next="gettingBody"/>
17: </condition>
18: <condition cond="else" params="">
19: <transition next="startState"/>
20: </condition>
21: </conditional>
22: </state>
23: <state name="gettingBody">
24: <conditional>
25:    <condition cond="EQUAL" params="RXsourceReadyBar, 0">
26: <operation op="ADD" params="writes, writes, 1"/>
27: <operation op="ADD" params="myaddress, myaddress, 1"/>
28: <operation op="WRITE_DATA" params="RXdata, myaddress[9:0]"/>
29: <conditional>
30:    <condition cond="EQUAL" params="RXendofFrameBar, 1">
31: <operation op="ADD" params="count, count, 2"/>
32: </condition>
33: <condition cond="else" params="">
34: <operation op="ADD" params="count, count, 1, RXrem"/>
35: </condition>
36: </conditional>
37: </condition>
38: </conditional>
39: <conditional>
40:    <condition cond="EQUAL" params="RXendofFrameBar, 0">
41: <transition next="writeLength"/>
42: </condition>
43: <condition cond="else" params="">
44: <transition next="gettingBody"/>
45: </condition>
46: </conditional>
47: </state>
48: <state name="writeLength">
49: <operation op="WRITE_DATA" params="count, 0"/>
50: <operation op="ADD" params="writes, writes, 1"/>
51: <transition next="commitPacket"/>
52: </state>
53: <state name="commitPacket">
54: <operation op="COMMIT_WRITE" params="writes[9:0]"/>
55: <transition next="startState"/>
56: </state>
57: </states>
58: </FSM>
```

APPENDIX E

```
<connection name="c1">
  <src element="sender" port="myout"/>
  <sink element="receiver_1" port="myin"/>
  <sink element="receiver_2" port="myin"/>
</connection>
```

The invention claimed is:

1. A design tool for designing a message processing system for implementation using an integrated circuit, comprising:
   an input section for inputting a specification of processing operations and memory attributes of said message processing system;
   an application programming interface (API) database coupled to the input section, the API database including a first set of primitives executable to define memory components, a second set of primitives executable to define threads of a processing component, and a third set of primitives executable to define a function block;
   a first database for storing a message processing architecture having a memory component and a processing component;
   a second database for storing an integrated circuit architecture; and
   a computer configured with program code that implements a message processing section, comprising:

a first portion for generating an instance of said memory component and an instance of said processing component to produce a logical view of said message processing system;

wherein the first portion, responsive to execution of primitives of the first set specified in the specification, generates the instance of the memory component;

wherein the first portion, responsive to execution of primitives of the second set specified in the specification, generates a plurality of threads of the processing component;

wherein each thread includes start, stop, suspend, and clock input terminals for controlling operation thereof, is-finished and is-suspended output terminals, and start control, stop control, and suspend control output buses;

wherein at least one of the is-finished and is-suspended output terminals and start control, stop control, and suspend control output buses is coupled to one or more of the input terminals of one or more others of the plurality of threads;

the is-finished and is-suspended output terminals for conveying status information related to each thread;

the start control, stop control, and suspend control output buses for controlling operation of the one or more others of the plurality of threads;

wherein the first portion, responsive to execution of primitive of the third set specified in the specification, generates an instance of a function block; and a second portion for implementing said memory component instance and said processing component instance in terms of said integrated circuit architecture to produce a physical view of said message processing system.

2. The design tool of claim 1, further comprising:
a third database for storing a set of primitives;
wherein said input section is configured to specify said processing operations and said memory attributes in terms of primitives in said set of primitives.

3. The design tool of claim 2, wherein said set of primitives comprises program code for driving said message processing section to produce said logical view.

4. The design tool of claim 3, wherein said program code is callable by a second design tool in communication with said input section.

5. The design tool of claim 2, wherein said set of primitives comprise descriptions for interpretation by said message processing section to produce said logical view.

6. The design tool of claim 1, wherein said processing component includes a plurality of thread for concurrently accessing said memory component and processing messages in the memory component, wherein said integrated circuit is a programmable logic device, and wherein said plurality of threads are implemented using programmable logic of said programmable logic device.

7. An apparatus for message processing using an integrated circuit, comprising:
means for receiving messages to said integrated circuit;
a memory for storing said messages; and
a first configured portion within said integrated circuit for concurrently accessing said memory with a plurality of thread circuits to process said messages;
wherein each thread circuit includes start, stop, suspend, and clock input terminals for controlling operation thereof, is-finished and is-suspended output terminals, and start control, stop control, and suspend control output buses, and
wherein at least one of the is-finished and is-suspended output terminals and start control, stop control, and suspend control output buses is coupled to one or more of the input terminals of one or more others of the plurality of thread circuits,
the is-finished and is-suspended output terminals for conveying status information related to the thread,
the start control, stop control, and suspend control output buses for controlling operation of the one or more others of the plurality of thread circuits.

8. The apparatus of claim 7, wherein said integrated circuit comprises a programmable logic device, and wherein said plurality of threads are implemented using programmable logic blocks of said programmable logic device.

9. The apparatus of claim 7, wherein each of said plurality of threads is a state machine.

10. The apparatus of claim 7, further comprising a second memory for storing state data associated with said plurality of thread circuits.

11. The apparatus of claim 7, comprising a second configured portion of said integrated circuit for communication amongst said plurality of threads.

* * * * *